(12) United States Patent
Minervini

(10) Patent No.: US 8,450,817 B2
(45) Date of Patent: May 28, 2013

(54) MICROELECTROMECHANICAL SYSTEM PACKAGE WITH STRAIN RELIEF BRIDGE

(75) Inventor: Anthony Minervini, Palos Hills, IL (US)

(73) Assignee: Knowles Electronics LLC, Itasca, IL (US)

( * ) Notice: Subject to any disclaimer, the term of this patent is extended or adjusted under 35 U.S.C. 154(b) by 313 days.

(21) Appl. No.: 12/191,857

(22) Filed: Aug. 14, 2008

(65) Prior Publication Data

US 2010/0038733 A1   Feb. 18, 2010

(51) Int. Cl.
*H01L 29/84* (2006.01)

(52) U.S. Cl.
USPC ........... 257/416; 257/414; 257/415; 257/419; 257/690; 257/E29.324

(58) Field of Classification Search
USPC ........... 257/414, 415, 416, 419, 690, E29.324
See application file for complete search history.

(56) References Cited

U.S. PATENT DOCUMENTS

| | | | |
|---|---|---|---|
| 7,843,021 B2 * | 11/2010 | Zhe et al. | 257/416 |
| 2007/0057602 A1 * | 3/2007 | Song | 310/328 |
| 2009/0218668 A1 * | 9/2009 | Zhe et al. | 257/680 |
| 2010/0046780 A1 * | 2/2010 | Song | 381/361 |
| 2010/0119087 A1 * | 5/2010 | Kimura | 381/174 |
| 2010/0119097 A1 * | 5/2010 | Ohtsuka | 381/361 |
| 2010/0167799 A1 * | 7/2010 | Makihata et al. | 455/575.1 |

* cited by examiner

*Primary Examiner* — Andy Huynh
(74) *Attorney, Agent, or Firm* — Dykema Gossett PLLC

(57) ABSTRACT

A strain absorption bridge for use in a MEMS package includes a first substrate that is configured to be attachable to a circuit board. A first elastically deformable element is coupled to the first substrate and the first elastically deformable element is configured to be attachable to a MEMS device. Alternatively, the MEMS device may be attached to the first substrate. The elastically deformable element at least partially absorbs and dissipates mechanical strain communicated from the circuit board before the mechanical strain can reach the MEMS device.

22 Claims, 13 Drawing Sheets

MICROELECTROMECHANICAL SYSTEM PACKAGE WITH STRAIN RELIEF BRIDGE

FIELD OF INVENTION

This invention generally relates to microelectromechanical system packages, and more particularly, to MicroElectroMechanical System (MEMS) packages providing relief from applied stress, strain or other forces.

BACKGROUND

Mobile communication technology has progressed rapidly in recent years. Consumers are increasingly employing mobile communication devices such as cellular phones, web-enabled cellular telephones, Personal Digital Assistants (PDAs), hand-held computers, laptops, notebooks, tablets or other types of devices that are capable of communicating over public or private communication networks.

The size of these devices has also decreased in recent years. As the size of the devices decreases, there is an increasing demand for smaller and thinner components to be used within these devices. In this regard, MicroElectroMechanical System (MEMS) microphones and other components are sometimes used in mobile communication devices in order to reduce component (and hence overall device) size. Other approaches may also be used to minimize device and component size. For instance, in cellular phones, the spacing between the keyboard printed circuit board (PCB) (where the MEMS microphone is typically mounted) and the outer case of the phone may be reduced to a minimum in order to achieve an overall thin phone.

Due to their mobility and size, mobile communication devices are often dropped, hit, bumped, or otherwise abused, which loosens or otherwise damages the internal components of the device. For instance, if a cellular phone is hit on or around the receiver, a MEMS microphone deployed near the receiver may become dislodged or otherwise damaged rendering the cellular phone inoperative. As the size of electronic devices decreases, the likelihood of damage or inoperability due to applied mechanical stress or strain increases since the force impact on the electronic device is nearer to the MEMS components.

Previous approaches have been unsuccessful in both providing devices with thin or minimal dimensions and providing protection from mechanical stress, strain, or other forces applied to the device. For instance, in some previous systems, a compliant adhesive is used to mount the delicate MEMS components in the device. Unfortunately, in this approach, the MEMS components still become loosened or otherwise damaged since the adhesive loosens over time. Consequently, the stress, strain, or other forces applied to the mobile communication device still loosen or damage sensitive MEMS components in the device. This may, in turn, completely disable or create malfunctions in the device.

BRIEF DESCRIPTION OF THE DRAWINGS

For a more complete understanding of the disclosure, reference should be made to the following detailed description and accompanying drawings wherein.

Figure 1:
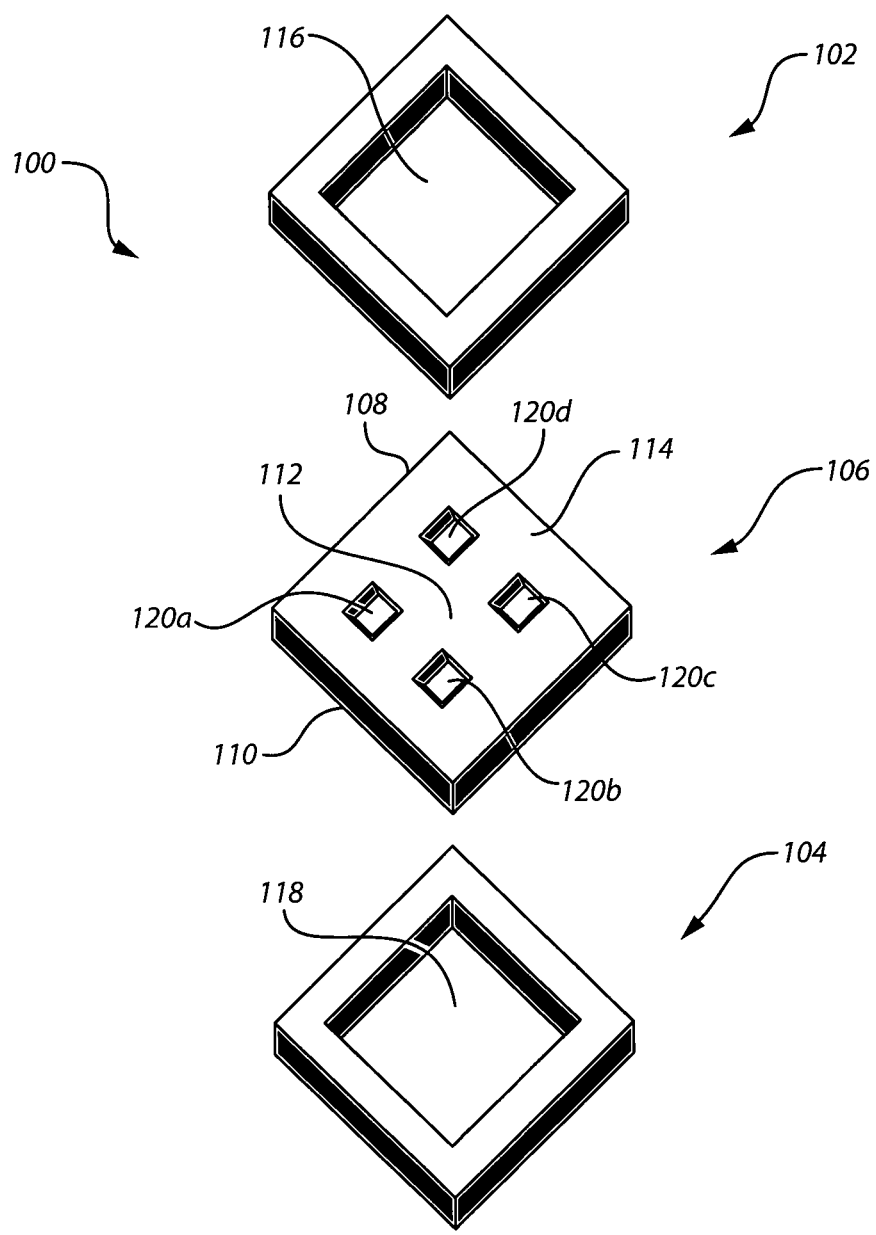
FIG. 1 is an exploded view of a bridge according to various embodiments of the present invention.

Skilled artisans will appreciate that elements in the figures are illustrated for simplicity and clarity. It will further be appreciated that certain actions and/or steps may be described or depicted in a particular order of occurrence while those skilled in the art will understand that such specificity with respect to sequence is not actually required. It will also be understood that the terms and expressions used herein have the ordinary meaning as is accorded to such terms and expressions with respect to their corresponding respective areas of inquiry and except where specific meanings have otherwise been set forth herein.

DETAILED DESCRIPTION

While the present disclosure is susceptible to various modifications and alternative forms, certain embodiments are shown by way of example in the drawings and these embodiments will be described in detail herein. It will be understood, however, that this disclosure is not intended to limit the invention to the particular forms described, but to the contrary, the invention is intended to cover all modifications, alternatives, and equivalents falling within the spirit and scope of the invention defined by the appended claims.

Devices and approaches for assembling and using these devices are provided that allow for the absorption and dissipation of mechanical stress, strain, and other forces in compact electronic devices that utilize MEMS devices or other sensitive components. A bridge is coupled between a circuit board and a MEMS device and the bridge absorbs and dissipates strain and/or other forces applied to the circuit board before these forces can reach the MEMS device. Consequently, component malfunctions due to stress or strain applied to the circuit board are significantly reduced or eliminated thereby creating more reliable electronic devices. Since malfunctions caused by forces applied to the devices are significantly reduced or eliminated, user satisfaction with the device is enhanced.

In many of these embodiments, a strain absorption bridge for use in a MEMS package includes a first substrate that is configured to be attachable to a circuit board. A first elastically deformable element is coupled to the first substrate and the first elastically deformable element is configured to be attachable to a MEMS device. The first elastically deformable element at least partially absorbs and dissipates mechanical strain communicated from the circuit board before the mechanical strain can reach the MEMS device.

The first substrate can assume a variety of shapes and configurations. In one example, the first substrate is ring-shaped and defines a first opening extending to the circuit board.

In other examples, the strain absorption bridge includes a housing and the housing is coupled to the first substrate. In other examples, the housing is coupled to the first elastically deformable element.

In still other examples, the strain absorption bridge further includes a second elastically deformable element that is arranged to at least partially enclose the MEMS device and the first elastically deformable element. In still other examples, a second substrate is provided and coupled to the first substrate and the second elastically deformable element is supported by the second substrate.

In others of these embodiments, the bridge also includes a second substrate. In some of these approaches, the first elastically deformable element is coupled to the first substrate and the second substrate.

In yet others of these embodiments a strain absorption bridge for use in a MEMS package includes a first substrate and the first substrate is configured to be coupled to a MEMS device. A first elastically deformable element is coupled to the first substrate and at least partially absorbs and dissipates mechanical strain communicated from a circuit board before the mechanical strain can reach the MEMS device.

In some approaches, the first elastically deformable element defines an opening extending to the first substrate. In other approaches, the first elastically deformable element is configured to be coupled to the circuit board.

The bridge may also include a second elastically deformable element that at least partially encloses the first elastically deformable element. In other examples, a housing is configured to enclose the MEMS device.

In still others of these approaches, a second substrate is provided. The first elastically deformable element is configured to be coupled to the second substrate. A second elastically deformable element at least partially encloses the MEMS device. In some examples, the second elastically deformable element is coupled to the second substrate. In yet other examples, the second elastically deformable element is coupled to the first substrate.

In other approaches, the strain absorption bridge further includes a housing. The housing is coupled to the first substrate and at least partially encloses the MEMS device.

In still others of these embodiments, a strain absorption bridge comprises a first substrate, a second substrate, and a elastically deformable element. The elastically deformable element is formed between the first substrate and the second substrate and is connectable to a MEMS device. A plurality of contact members are applied to the first substrate and the second substrate, and at least partially surround the elastically deformable element. The contact members are connected to a circuit board. In operation, the elastically deformable element at least partially absorbs and dissipates mechanical strain communicated from the circuit board before the mechanical strain can reach the MEMS device.

The elastically deformable element of these examples may be formed from any material or materials that are flexible compared to the first and second substrates. In this regard, the elastically deformable element may be an FR-4 material such as polyimide or poly-tetrafluoro-ethylene (PTFE). Other examples of materials may also be used.

In any of these approaches, the bridge may also include additional elements that provide for the flexibility of the elastically deformable element. For instance, the elastically deformable element or substrate may include at least one opening that completely extends through the elastically deformable element. When the openings are provided, an environmental layer may also be formed that provides to prevent debris from traversing the opening and damaging the MEMS device. The environmental layer can be formed from a variety of materials such as perforated polyimide, poly-tetrafluoro-ethylene (PTFE), porous aluminum, or micromesh metal materials.

The strain absorption bridge can be configured in many different shapes, sizes, and/or dimensions and have additional features. In one example, the first substrate may be ring shaped and provide an opening (or hole) extending to the elastically deformable element. In this example, the MEMS device may reside in the opening and may be coupled therein to the elastically deformable element.

The bridge may be structured so as to allow for the convenient positioning of the MEMS device, such that the height of the MEMS device does not extend beyond the overall height of the bridge. In this regard, the bridge may reside over an opening in the circuit board such that the MEMS device resides at least partially in the opening. Because of this configuration, the height of the MEMS device is perceived to be zero since the MEMS device is lower than any component on any side of the circuit board.

Acoustic ports may also be provided with any of the bridges described herein. For example, the elastically deformable element may include one or more acoustic ports and the MEMS device may communicate with these ports. Sealing rings may also be provided with the bridge. In one example, a plurality of sealing rings may be coupled to the first substrate and the circuit board.

In others of these embodiments, at least one conductive layer may be provided with the bridge. The conductive layers may serve a number of purposes such as providing for power and ground connections for the circuit board or providing for the construction of components such as capacitors. In addition, the first and second substrates may be comprised of alternating conducting and non-conducting layers.

Thus, approaches are provided that reduce or eliminate stress, strain or other forces in electronic packages (e.g., MEMS packages used in mobile communication or other electronic devices) thereby protecting MEMS and other sensitive devices deployed within these packages. In some of these approaches, a bridge is coupled between a circuit board and a sensitive MEMS device to significantly reduce or eliminate stress or strain imparted on the circuit board before the stress or strain can reach the MEMS device. In so doing, damage and/or dislodging of the MEMS device is avoided thereby preventing the malfunction or failure of the electronic device.

Figure 2:
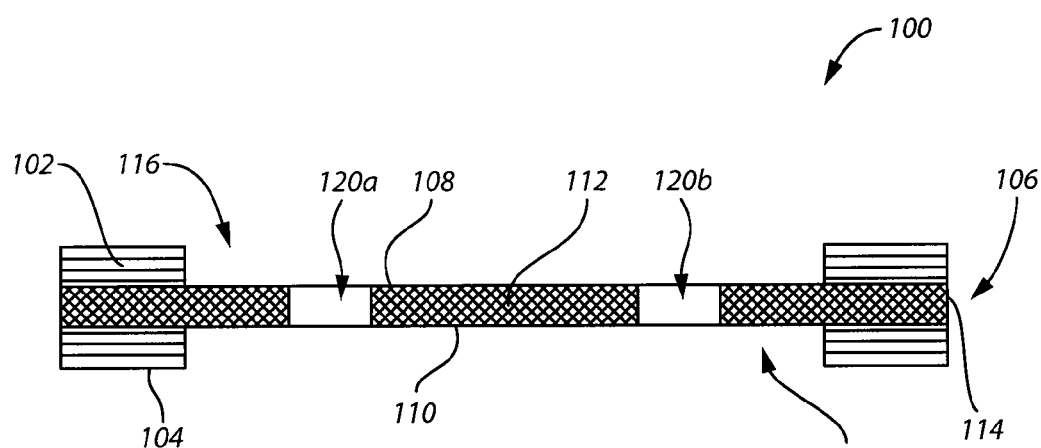
FIG. 2 is a cross-sectional view of a bridge according to various embodiments of the present invention.

Turning now to the drawings and referring specifically to FIGS. 1-2, a bridge 100 provides a connection between an end-user circuit board (not shown) and a MEMS device (not shown). The bridge 100 includes a first substrate 102, a second substrate 104, and a elastically deformable element 106.

The first and second substrates 102 and 104 provide stiffeners as compared to the elastically deformable element 106. The elastically deformable element 106 has a top surface 108, a bottom surface 110, a central portion 112 and an edge portion 114 there around. The first substrate 102 and the second substrate 104 have openings 116 and 118, which communicate with the edge portion 114 of the elastically deformable element 106 in such a way that the first substrate 102 is formed on the top surface 108 of the elastically deformable element 106 and the second substrate 104 is formed on the bottom surface 110 of the elastically deformable element 106. As mentioned, an end-user circuit board (not shown) and a MEMS device (not shown) are coupled to the bridge 100.

The bridge 100 is comprised of a generally compliant (flexible) material as compared to the substrates 102 and 104. When the printed circuit board (PCB) deforms under shock or a load, the bridge 100 strains to absorb the force, thereby minimizing or eliminating the stress, strain, or other force transfer to the MEMS device.

The MEMS device contains a MEMS die. In one example, the MEMS device is a surface mounted device (SMD) whereby the MEMS die is mounted onto a base. A housing may be further attached to the base to fully enclose and protect the MEMS die. The MEMS device is preferably surface-mounted to the bridge 100 using solder. Alternatively, the bridge 100 may be an integral part of the MEMS device whereby the MEMS die is directly mounted to the bridge 100 using, for instance, chip-on-board technology. A housing mounted around the MEMS die is used to protect the die.

The amount of force that can be absorbed and/or dissipated by the bridge 100 depends upon a variety of factors. For example, the amount of strain, stress, or other forces that can be absorbed by the bridge element 100 may be a function of the modulus of elasticity of the elastically deformable element 106, the thickness of the elastically deformable element 106, the size of the MEMS device to be mounted to the elastically deformable element 106, and the dimensions of the openings 116 and 118 in the first and second substrates 102 and 104, respectively. These factors may be used to select the materials used to construct the bridge and the dimensions of the bridge. In addition, other factors may also be considered when determining the materials and dimensions of the bridge.

The different layers of the bridge 100 are formed during manufacturing and may include depositing, and/or forming or otherwise creating a layer of material using any other technique or approach. In one example, the first and second substrates 102 and 104 may comprise FR-4 fiberglass reinforced epoxy resin allowing forming the substrate into board panel form, thus taking advantage of economies of scale in manufacturing. The elastically deformable element 106 may be made of a thin layer of polyimide, or poly-tetrafluoroethylene (PTFE). In other examples, the first substrate 102, second substrate 104, and the elastically deformable element 106 may utilize multiple layers of conductive and/or non-conductive materials having sufficient rigidity. It is to be understood that materials other than those described above may be utilized as well as materials not necessary having rigidity.

The first and second substrates 102 and 104 are shown generally having horizontal cross-sectional shape that is a square or rectangular ring-shaped. However, any type of ring shape may be used and other non-ring circular shape (e.g., ellipses, circles) may also be employed.

As shown in FIGS. 1-2, at least one through cavity 120 (four are illustrated as cavities 120a, 120b, 120c, and 120d) may be introduced on the central portion 112 of the elastically deformable element 106 to increase the compliance of the bridge 100. For simplicity, when referring to the one or more cavities may be made to the through cavity 120 with the understanding the one or more such cavities may be provided.

Figure 3:
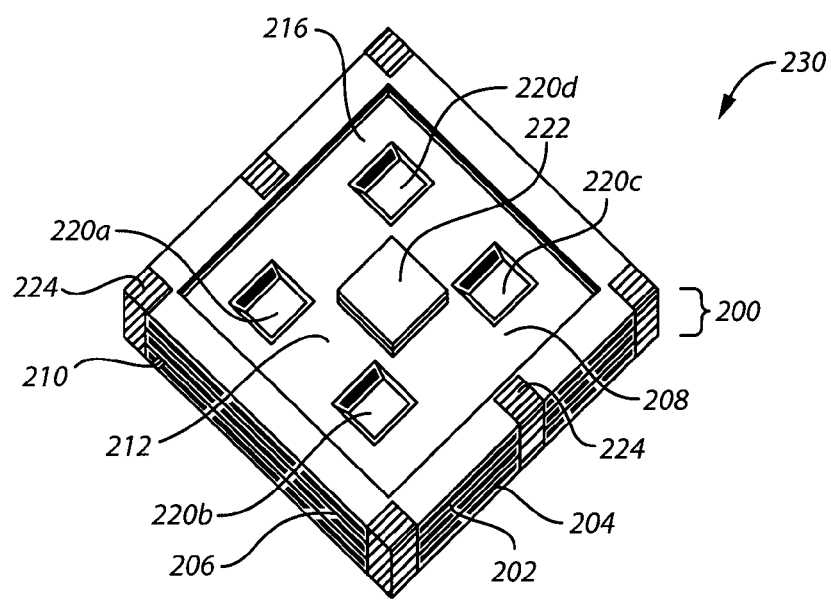
FIG. 3 is a diagram of a bridge utilized in a MEMS package according to various embodiments of the present invention.
Figure 4:
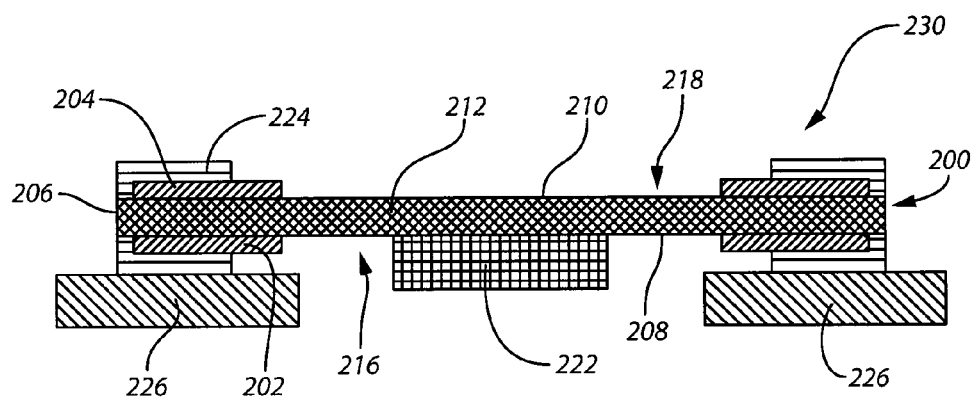
FIG. 4 is a cross-sectional view of the bridge of FIG. 3 according to various embodiments of the present invention.

FIGS. 3-4 illustrate a bridge 200 that can be used in a MEMS package 230. The bridge 200 is similar in construction and function as the bridge 100 illustrated in FIGS. 1 and 2, and like elements are referred to using like reference numerals herein, for example 100 and 102 correspond to 200 and 202, respectively. A surface mountable component (SMC) 222 is attached to a top surface 208 of a central portion 212 of a elastically deformable element 206 in such a way that the SMC 222 is positioned within an opening 216 of the first substrate 202. Alternatively, the SMC 222 may be attached to a bottom surface 210 of the elastically deformable element 206 in such a way that the SMC 222 is received in an opening 218 of the second substrate 204.

The SMC 222 may comprise a MEMS device (or devices), for example, a transducer or silicon-based microphone such the silicon condenser microphone disclosed in U.S. Pat. Nos. 5,870,482, 7,166,910, and/or 6,781,231, the disclosures of which are herein incorporated by reference in their entirety for all purposes. Other examples of SMCs and MEMS devices are possible.

A plurality of contact pads 224, for example, made of Copper (Cu) with a finishing layer of either Tin (Sn) or Nickel/Gold (Ni/Au), are applied on the first substrate 202 and at least partially surround the elastically deformable element 206 and to the second substrate 204 provides electrical contact to an end-user circuit board 226 which in turn provides electrical contact to the SMC 222. In the example shown, the SMC 222 is electrically connected to the end-user circuit board 226 via the bridge 200 in such a way that the SMC 222 and the end-user circuit board 226 face to a same direction. Alternatively, the end-user circuit board 226 is attached to the second substrate 204 at or near the contact pad 224 and the SMC 222 is attached to the top surface 208 of the elastically deformable element 206 may be electrically connected via the bridge 200. This minimizes strain transfer from the end-user circuit board 226 to the SMC 222 via the bridge 200.

The end-user circuit board 226 may be any type of circuit card or board used in mobile communication devices. In one example, the circuit board 226 may be a board that processes sounds received from the SMC 222. Other examples of end-user circuit boards are possible. Consequently, the height of the SMC 222 is "zeroed out." In other words, the height of the SMC 222 is effectively zero when determining the overall height of the MEMS package 230.

Figure 5:
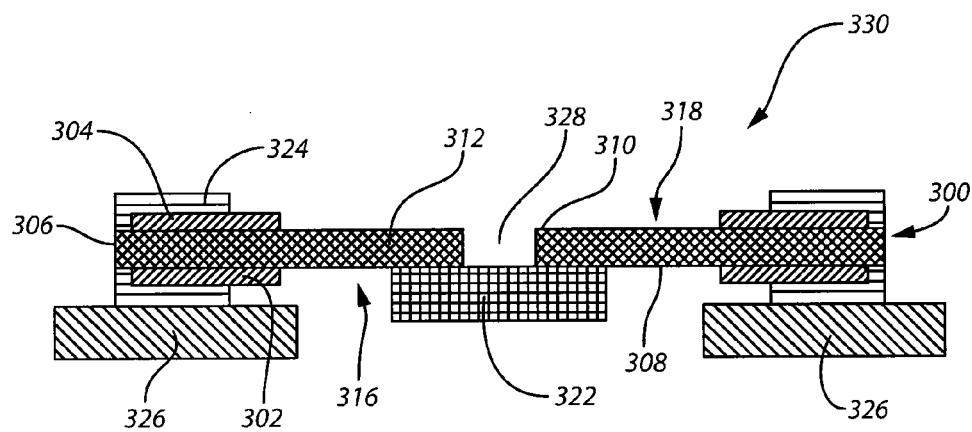
FIG. 5 is a cross-sectional view of another example of a bridge utilized in a MEMS package according to various embodiments of the present invention.
Figure 6:
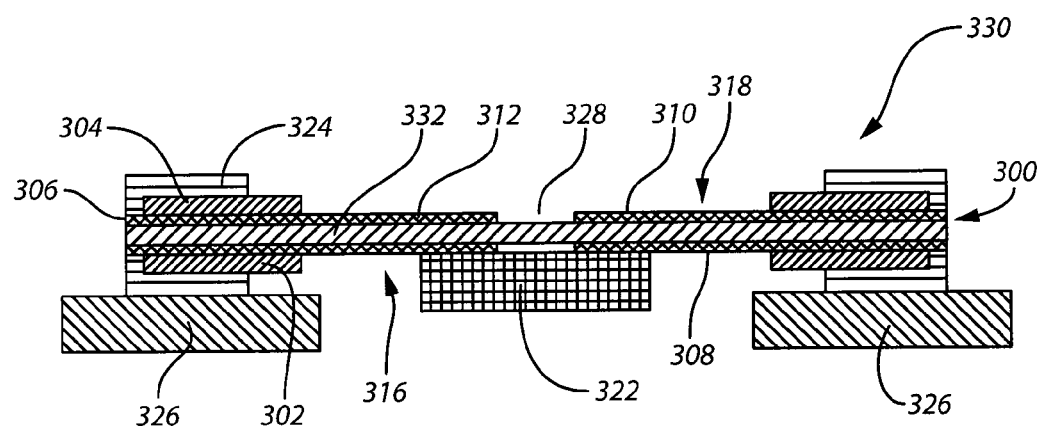
FIG. 6 is a cross-sectional view of a bridge having an environmental barrier according to various embodiments of the present invention.

Referring now to FIGS. 5-6, another example of a bridge 300 that can be used in a MEMS package 330 is depicted. The bridge 300 is similar in construction and function as the bridge 200 illustrated in FIGS. 3 and 4, and like elements are referred to using like reference numerals herein, for example 200 and 202 correspond to 300 and 302, respectively.

An acoustic port 328 is introduced and provided on a central portion 312 of the elastically deformable element 306 across a SMC 322 in order to provide an acoustic pathway to the SMC 322. The acoustic port 328 may be formed by a number of methods, including drilling through the elastically deformable element 306 to form an acoustic pathway to the SMC 322. A gasket seal (not shown) such as a B-staged epoxy may be formed on a bottom surface 310 of the elastically deformable element 306 to cover the acoustic port 328 thus prevents leakage of acoustic waves from the acoustic pathway coupling the SMC 322 to the outside of the MEMS package 330. Alternatively, a ring of metal may be soldered on a bottom surface 310 of the elastically deformable element 306 to form a gasket seal (not shown).

In the example shown, the acoustic port 328 is covered by the SMC 322 which may be "bumpbonded" and mounted face down. As a result, the MEMS package 330 provided by the present approach advantageously reduces the overall height of MEMS package 330 when mounted to an end-user circuit board 326 within a housing of a device. The MEMS package 330 may be a plug-in-type unit.

As shown in FIG. 6, an environmental barrier 332 is formed within the elastically deformable element 306 and the acoustic port 328 in order to prevent debris from entering the MEMS package 330 and damaging the SMC 322. The environmental barrier 332 may be formed of a material having acoustic resistive properties such as a polymeric material, for instance, a perforated Polyimide, Poly-Tetrafluoro-Ethylene (PTFE), a Porous Aluminum, or a micro mesh metal screen. The environmental barrier 332 may further be selected to have acoustic properties, such as acoustic resistive properties, so as to improve the frequency response, create delay and provide directional response.

Figure 7:
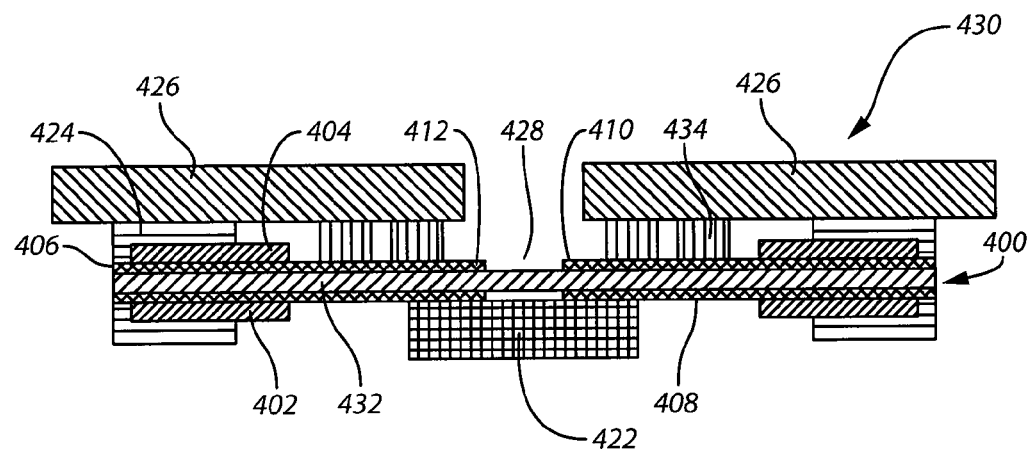
FIG. 7 is a cross-sectional view of another example of a bridge utilized in a MEMS package according to various embodiments of the present invention.

Referring now to FIG. 7, a cross-sectional view of a bridge 400 that can be used in a MEMS package 430 is described. The bridge 400 is similar in construction and function as the bridge 300 illustrated in FIGS. 5 and 6, and like elements are referred to using like reference numerals herein, for example, 300 and 302 correspond to 400 and 402, respectively.

A plurality of sealing rings 434 are provided on a bottom surface 410 of a elastically deformable element 406 to seal an acoustic port 428 during surface mounting to an end-user circuit board 426. The end-user circuit board 426 provided on the bottom surface 410 of the elastically deformable element 406 via the sealing ring 434 and a contact pad 424 is electrically connected to a SMC 422 formed on the top surface 408 of a central portion 412 of the elastically deformable element 406. This provides an electrical connection between the end-user circuit board 426 and the SMC 422. Further, it allows strain relief from the end-user circuit board 426 to the SMC 422.

An environmental barrier 432 is formed within the elastically deformable element 406 and the acoustic port 428 to prevent debris from entering the MEMS package 430 and damaging the SMC 422. The environmental barrier 432 may further be selected to have acoustic properties, such as acoustic resistive properties, to improve the frequency response, create delay and provide directional response. The MEMS package 430 provided by the present approach advantageously reduces the overall height of MEMS package 430 when mounted to an end-user circuit board 426 within a housing of a device. In addition, the MEMS package may be a plug-in-type unit.

Figure 8:
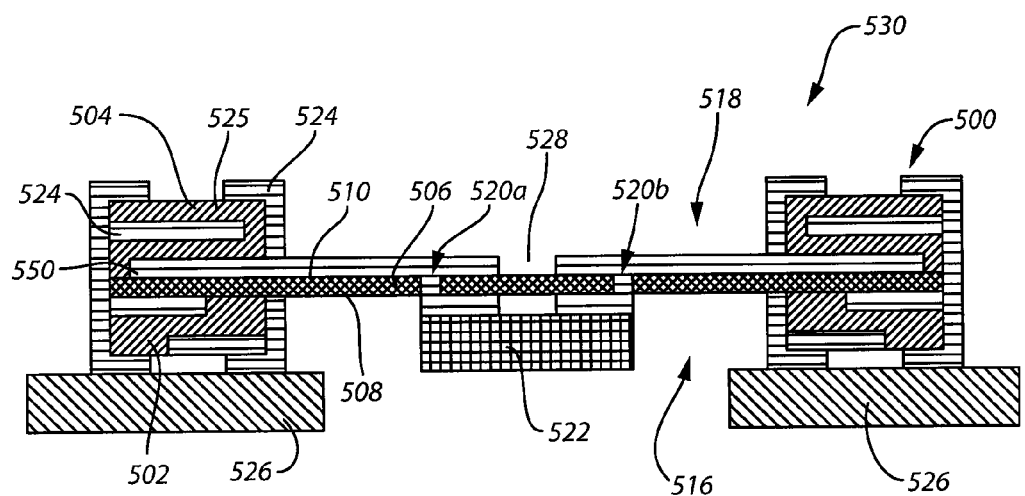
FIG. 8 is a cross-sectional view of still another example of a bridge utilized in a MEMS package according to various embodiments of the present invention.

FIG. 8 illustrates a cross-sectional view of a bridge 500 that is used in a MEMS package 530. The bridge 500 is similar in construction and function as the bridge 400 illustrated in FIG. 7, and like elements are referred to using like reference numerals herein, for example 400 and 402 correspond to 500 and 502, respectively.

In FIG. 8, a conductive layer 550 made of Copper (Cu) with a finishing layer of either Tin (Sn) or Nickel/Gold (Ni/Au) is formed on a bottom surface 510 of a elastically deformable element 506 and also fills the cavities 520a and 520b to provide an electrical connection to an end-user circuit board 526.

The conductive layer 550 may be patterned to form circuitry, ground planes, solder pads, ground pads, capacitors and plated through hole pads. The conductive layer 550 also provides electromagnetic interference (EMI) shielding while allowing configuration as capacitors and/or inductors to filter input/output signals and/or the input power supply. In addition, the conductive layers 550 may allow the coupling of the end-user circuit board 526 to a power supply, ground plane, or to the SMC 522.

In this example, first and second substrates 502 and 504 are generally comprised of alternating layers of conductive layers 524 and the non-conductive layers 525. The conductive layers 524 are typically Copper (Cu) and the nonconductive layers 525 are typically FR-4 fiberglass reinforced epoxy resin. The conductive layers 550 and 524 may be formed from the same or from different material depending upon the function of the particular layer.

Multi-layer construction of the substrates permits the inclusion of circuitry, power and ground planes, solder pads, ground pads, capacitance layers, and plated through hole pads. Additionally, the height of the SMC 522 is effectively zero due to its placement. Consequently, a reduced overall height of the MEMS package 530 when mounted to an end-user circuit board 526 within a housing of a device is achieved compared to previous approaches. Protection from EMI and other external and environmental conditions including shock and debris is also provided.

The non-conductive layers 525 may be formed from a variety of materials. In one example, the non-conductive layers may be formed from a dielectric.

Figure 9:
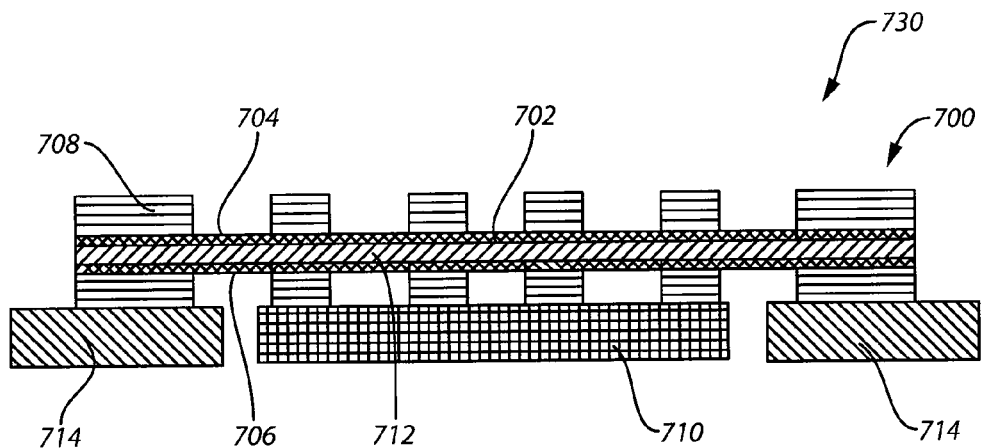
FIG. 9 is a cross-sectional view of yet another example of a bridge utilized in a MEMS package according to various embodiments of the present invention.

Referring now to FIG. 9, a cross-sectional view of a bridge 700 that can be used in a MEMS package 730 is described. The MEMS package 730 includes a surface mountable component (SMC) 710, a plurality of contact pads 708, a substrate 702 and an environmental barrier 712 within the substrate 702. The substrate 702 has a first surface 704 and a second surface 706. The plurality of contact pads 708 are electrically connected to the first surface 704 and second surface 706 of the substrate 702.

The SMC 710 is attached to the second surface 706 of the substrate 702 via the plurality of contact pads. The MEMS package 730 is mounted to an end-user circuit board 714 by the plurality of contact pads formed on the substrate 702. The MEMS package 730 achieves a reduction in overall height of MEMS package 730 when mounted to an end-user circuit board 714 within a housing of a device as compared to previous approaches. The MEMS package 730 may be a plug-in-type unit, for instance. Further, the approaches reduce strain or other force transfer from the end-user circuit board 714 to the SMC 710 via the bridge 700.

An environmental barrier 712 with acoustic resistive properties which is typically made of a polymeric material film such as perforated Polyimide, Poly-Tetrafluoro-Ethylene (PTFE), Porous Aluminum, or micro mesh metal screen may be formed within the substrate 702 to prevent debris from entering the MEMS package 730 and damaging the SMC 710. The environmental barrier 712 may further be selected to have acoustic properties, such as acoustic resistive properties, to improve the frequency response, create delay and provide directional response.

Referring now to FIGS. 10a, 10b, 11, and 17 an example of a MEMS package 1000 is described. The MEMS package 1000 includes a bridge 1001 and the bridge 1001 includes a substrate 1002 and an elastically deformable element 1004. A MEMS device 1006 is coupled to the elastically deformable element 1004, for example, by glue or some other suitable fastening approach. The substrate 1002 is coupled to an end-user circuit board 1008 by contact pads 1010. An opening 1009 extends through the substrate 1002 and is covered by the elastically deformable element 1004.

The substrate 1002 may be constructed of a variety of materials. In one example, the substrate 1002 is constructed from a FR-4 fiberglass reinforced epoxy resin that allows forming the substrate into a board-like panel form, thus taking advantage of economies of scale in manufacturing. Other examples of materials may be used for the substrate 1002. In one example, the thickness of the substrate 1002 is 0.3 mm.

The elastically deformable element 1004 may also be constructed from a wide variety of materials. In one example, the elastically deformable element 1004 is constructed of a thin layer of polyimide, or poly-tetrafluoro-ethylene (PTFE). Other examples of materials may be used for the elastically deformable element 1004. In one example, the thickness of the elastically deformable element 1004 is 0.025 mm.

Figure 10A:
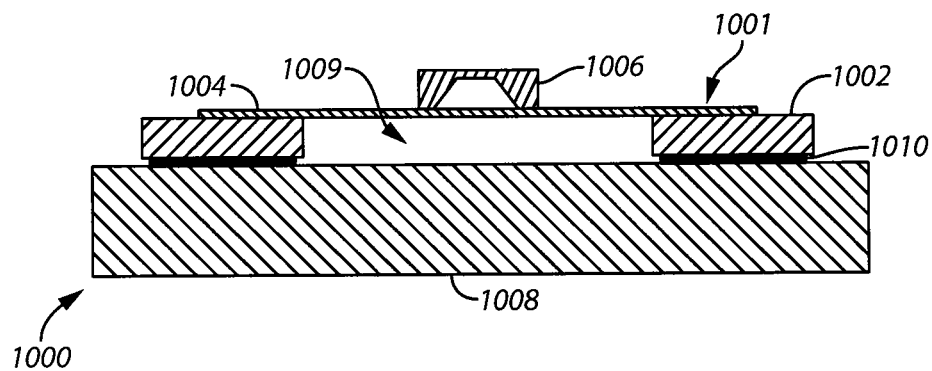
FIG. 10a is a cross-sectional view of another example of a bridge utilized in a MEMS package according to various embodiments of the present invention.
Figure 10B:
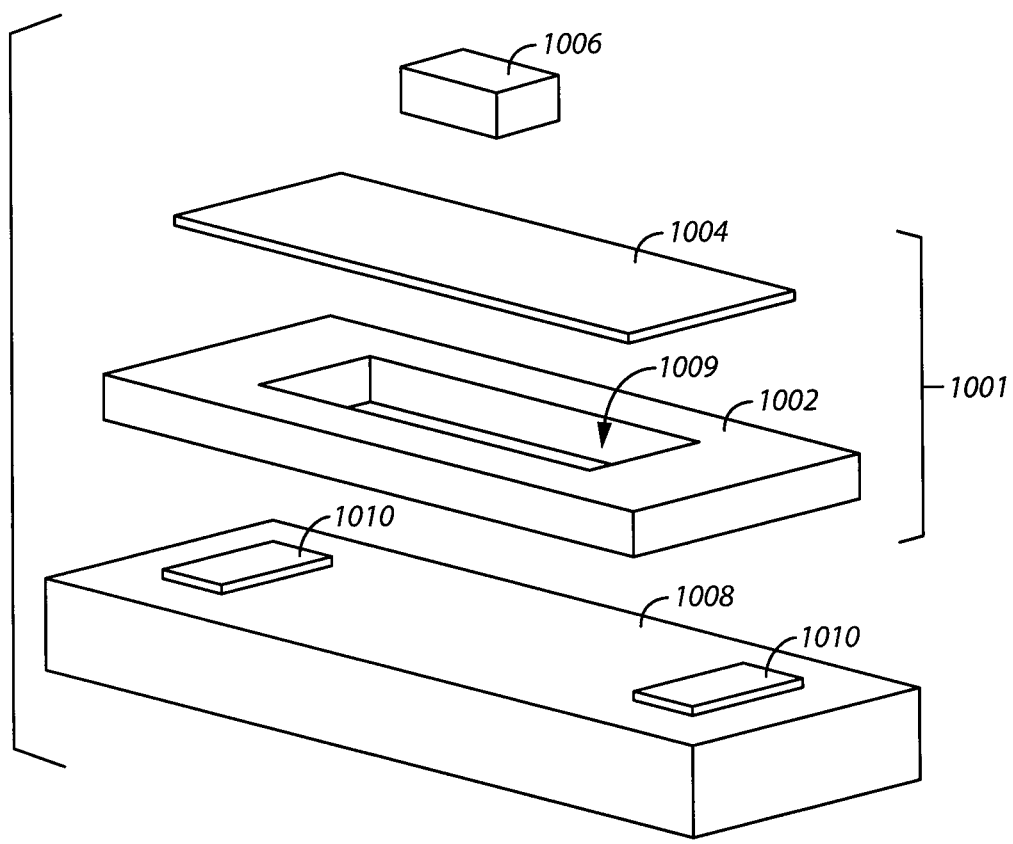
FIG. 10b is an exploded perspective view of the bridge of FIG. 10 according to various embodiments of the present invention.

In the examples of FIGS. 10a and 10b, the horizontal cross-section of the substrate 1002 is generally a square or rectangular ring-shaped. However, any type of ring shape or non-ring circular shape (e.g., ellipses, circles) may also be employed.

According to these approaches, the elastically deformable element 1004 is constructed of a generally compliant (flexible) material as compared to the substrate 1002. When the end-user circuit board 1008 deforms under shock or a load, the elastically deformable element 1004 strains to absorb the force, thereby minimizing or eliminating the stress, strain, or other force transfer to the MEMS device 1006. In this regard, the aggregate rigidity of the portion of the package 1000 in proximity to the MEMS device 1006 is less than the aggregate rigidity of the remainder of the package. The different elements of the bridge 1001 are formed during manufacturing and may be formed according to depositing techniques, and/or formed using any other technique or approach.

The amount of force that can be absorbed and/or dissipated by the bridge 1001 depends upon a variety of factors. For example, the amount of strain, stress, or other forces that can be absorbed by the bridge 1001 may be a function of the modulus of elasticity of the elastically deformable element 1004, the thickness of the elastically deformable element 1004, the size of the MEMS device 1006, to name a few factors. These factors may be used to select the materials used to construct the bridge 1001 and the dimensions of the bridge 1001. In addition, other factors may also be considered when determining the materials and/or dimensions of the bridge 1001.

Acoustic ports or other apertures may also be provided in the bridge 1001. For example, the elastically deformable element 1004 may include one or more acoustic ports and the MEMS device 1006 may communicate with these ports. Sealing rings may also be provided with the bridge 1001.

Additionally, the location of the MEMS device 1006 may be changed or adjusted. For example, the MEMS device 1006 may be attached to the bottom surface rather than the top surface of the elastically deformable element 1004. Consequently, in this alternative approach the height of the MEMS device 1006 is "zeroed out." In other words, the height of the MEMS device 1006 is effectively zero when determining the height of the MEMS package 1000.

In other examples, the substrate 1002 and the elastically deformable element 1004 may utilize multiple layers of conductive and/or non-conductive materials having sufficient rigidity. It is to be understood that materials other than those described above may be utilized as well as materials not necessary having rigidity.

The contact pads 1010 may be made, for example, of Copper (Cu) with a finishing layer of either Tin (Sn) or Nickel/Gold (Ni/Au). In one example, the pads 1010 are applied to the substrate 1002 and provide electrical contact to the end-user circuit board 1008.

The MEMS device (or devices) 1006 may be, for example, a transducer or silicon-based microphone such the silicon condenser microphone disclosed in U.S. Pat. Nos. 5,870,482, 7,166,910, and/or 6,781,231, the disclosures of which are incorporated by reference herein in their entirety for all purposes. The MEMS device 1006 may also be a surface mountable component. Other functions may be performed by MEMS devices.

The electrical connections of the package are configured such that the MEMS device 1006 can communicate with the end-user circuit board 1008. In this regard, various traces, wires, other electrical components (e.g., capacitors or resistors) or other electrical coupling arrangements may be used. These components may be incorporated in a separate conductive layer or by using some other approach.

The end-user circuit board 1008 may be any type of circuit board arrangement used to provide a variety of functions. In one example, the end-user circuit board 1008 is a printed circuit board 1008 that processes sound received from the MEMS device 1006. Other examples of functions may also be provided by the end-user circuit board 1008.

Figure 11:
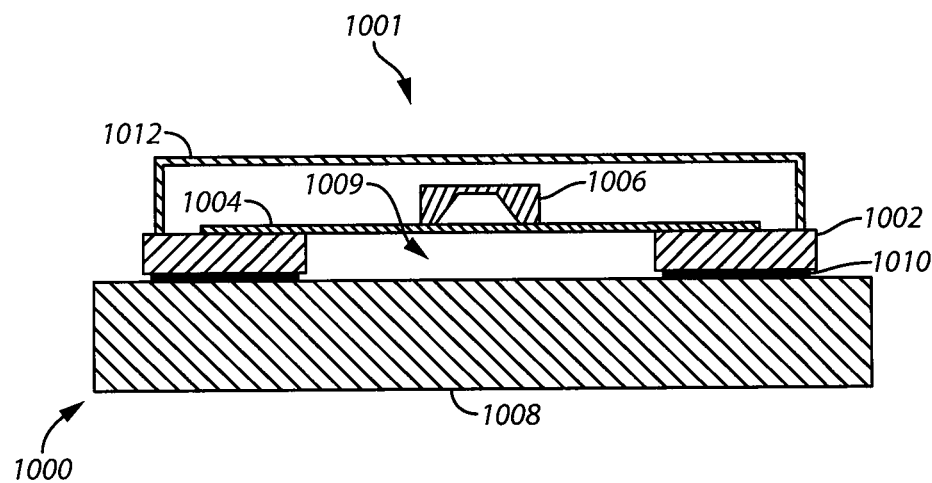
FIG. 11 is a cross-sectional view of still another example of a bridge utilized in a MEMS package according to various embodiments of the present invention.

The arrangement of FIG. 11 is similar to the construction and function of the bridge 1001 in FIGS. 10a and 10b except that a housing 1012 surrounds the MEMS device 1006 and is coupled to the substrate 1002. The housing 1012 may be coupled to the substrate 1002 by any suitable technique such as glue, fasteners, or the like. The housing 1012 may be constructed of any suitable material such as plastic, metal, or combinations of various materials. The housing 1012 is a hollow structure that provides protection for some or all of the components of the bridge 1001. In the example of FIG. 11, the housing 1012 is coupled to substrate 1002 at an outer edge of the substrate. The size and/or shape of the housing 1012 may be custom-configured to form an acoustic gasket having specific acoustic properties and/or to perform one or more specific customer applications.

Figure 17:
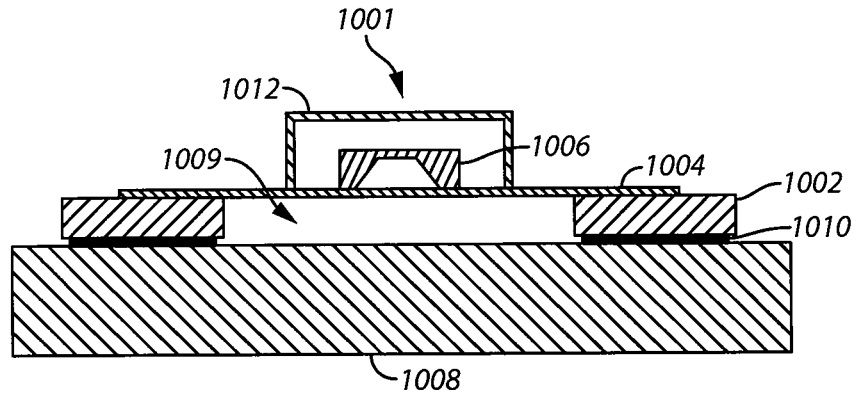
FIG. 17 is a cross-sectional view of still another example of a bridge utilized in a MEMS package according to various embodiments of the present invention.

Referring now to FIG. 17, the housing 1012 is smaller in size compared to the housing shown in FIG. 11. The smaller size of the housing 1012 provides a different profile for the package 1000 allowing the package to be used in different applications than the example of FIG. 11. As with the other examples described herein, the shape and/or size of the housing may be custom-configured to form an acoustic gasket having specific properties and/or to perform specific customer applications. The housing 1012 is coupled to the elastically deformable element 1004. The coupling may be accomplished by glue, fasteners, or any other suitable fastening technique. In the examples described herein, a housing (if used) can take on any appropriate size or dimensions depending upon, for example, the use of the MEMS package.

Figure 12A:
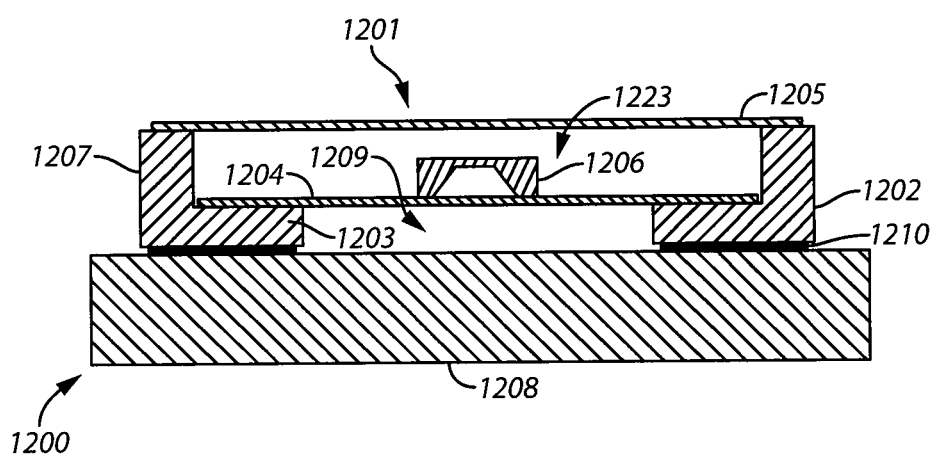
FIG. 12a is a cross-sectional view of yet another example of a bridge utilized in a MEMS package according to various embodiments of the present invention.
Figure 12B:
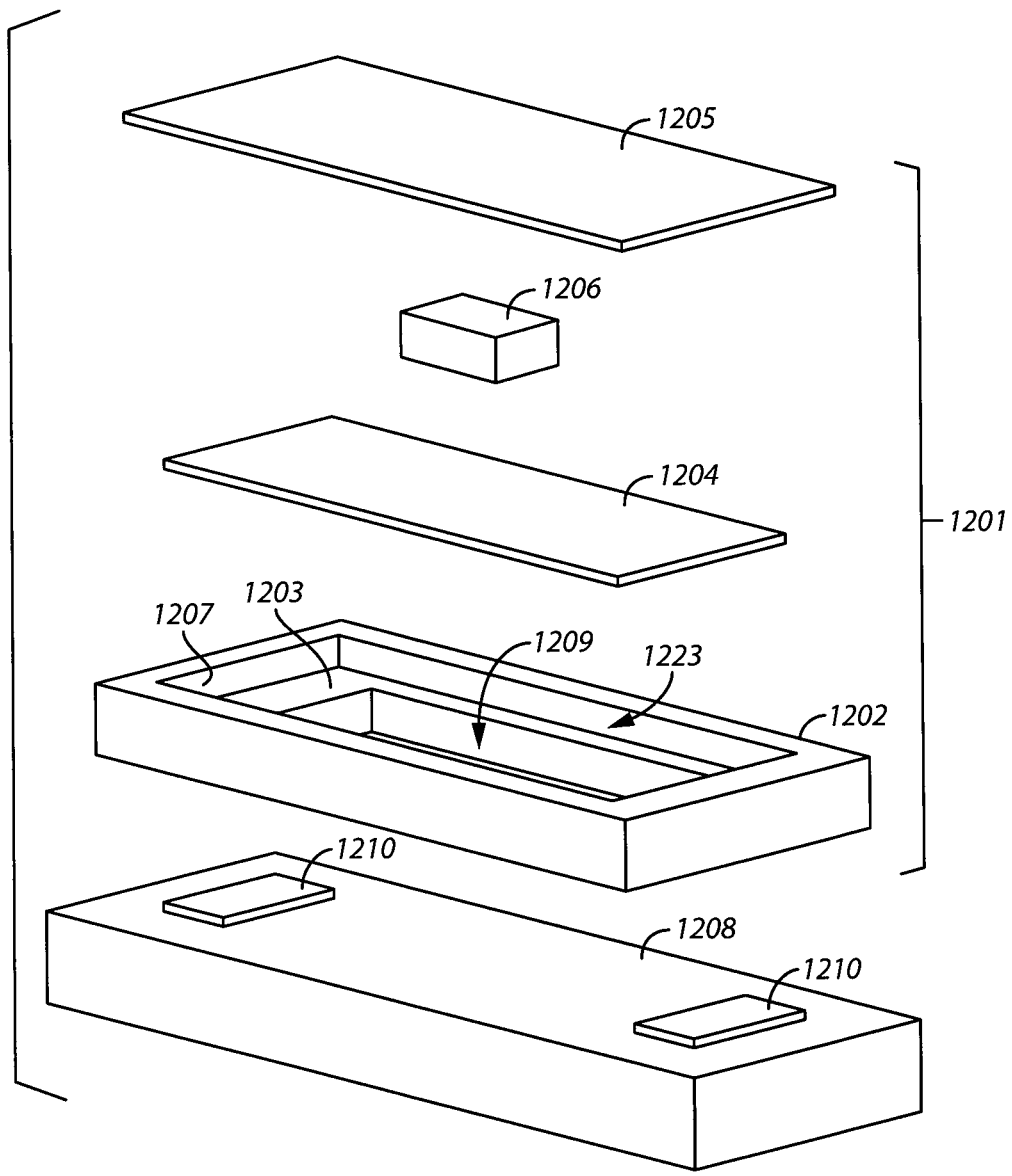
FIG. 12b is an exploded perspective view of the bridge of FIG. 12 according to various embodiments of the present invention.

Referring now to FIGS. 12a and 12b, another example of a MEMS package 1200 is described. A MEMS package 1200 includes a bridge 1201 and the bridge 1201 includes a substrate 1202 and a first elastically deformable element 1204. A MEMS device 1206 is coupled to the substrate 1202. The substrate 1202 is coupled to an end-user circuit board 1208 by contact pads 1210. The substrate 1202 has a lower portion 1203 and a side portion 1207. A second elastically deformable element 1205 is coupled to the side portion 1207 on an upper surface of the side portion 1207. The lower portion 1203 is coupled to the first elastically deformable element 1204. The couplings may be accomplished by glue, fasteners, or any other suitable fastening arrangement. An opening 1209 extends through the substrate 1202 and is covered by the elastically deformable element 1204.

In the examples of FIGS. 12a and 12b, the substrate 1202 is generally block shaped with a recess 1223 formed by the lower portion 1203 and the side portion 1207. The horizontal cross-sectional shape of the substrate 1202 is generally a square or rectangular ring-shaped. However, any type of ring shape or non-ring circular shape (e.g., ellipses, circles) may also be employed. The dimensions of the different portions may also vary.

The substrate 1202 may be constructed of a variety of materials. In one example, the substrate 1202 is constructed from a FR-4 fiberglass reinforced epoxy resin that allows forming the substrate into a board-like panel form, thus taking advantage of economies of scale in manufacturing. Other examples of materials may be used for the substrate 1202. In one example, the thickness of the substrate 1202 is 0.3 mm across the top surface while it is 0.5 mm in a vertical direction.

The first and second elastically deformable elements 1204 and 1205 may be made from a wide variety of materials. In one example, the first and second elastically deformable elements 1204 and 1205 are constructed of a thin layer of polyimide, or poly-tetrafluoro-ethylene (PTFE). Other examples of materials may be used to form the elastically deformable elements 1204 and 1205. In one example, the thicknesses of the elastically deformable elements 1204 and 1205 are 0.025 mm.

The first and second elastically deformable elements 1204 and 1205 are constructed of generally compliant (flexible) materials as compared to the substrate 1202. When the end-user circuit board 1208 deforms under shock or a load, the elastically deformable elements 1204 and 1205 strain to absorb the force, thereby minimizing or eliminating the stress, strain, or other force transfer to the MEMS device 1206. In this regard, the aggregate rigidity of the portion of the package in proximity to the MEMS device 1206 is less than the aggregate rigidity of the remainder of the package. The different elements of the bridge 1201 are formed during manufacturing and may be formed by any suitable technique such as depositing, and/or any other technique or approach.

The amount of force that can be absorbed and/or dissipated by the bridge 1201 depends upon a variety of factors. For example, the amount of strain, stress, or other forces that can be absorbed by the bridge 1201 may be a function of the modulus of elasticity of the elastically deformable element 1204, the thickness of the elastically deformable elements 1204 and 1205, the size of the MEMS device 1206, to name a few factors. These factors may be used to select the materials used to construct the bridge and the dimensions of the bridge. In addition, other factors may also be considered when determining the materials and dimensions of the bridge.

Acoustic ports or other apertures may also be provided in the bridge 1201. For example, the first and second elastically deformable elements 1204 and 1205 may include one or more acoustic ports and the MEMS device 1206 may communicate with these ports.

Additionally, the location of the MEMS device 1206 may be changed or adjusted. For example, the MEMS device 1206 may be attached to the bottom side rather than the top side of the first elastically deformable element 1204. Consequently, in this alternative approach the height of the MEMS device 1206 is "zeroed out." In other words, the height of the MEMS device 1206 is effectively zero when determining the height of the package 1200.

In other examples, the substrate 1202 and the elastically deformable element 1204 may utilize multiple layers of conductive and/or non-conductive materials having sufficient rigidity. It is to be understood that materials other than those described above may be utilized as well as materials not necessary having rigidity.

The contact pads 1210 may be made, for example, of Copper (Cu) with a finishing layer of either Tin (Sn) or Nickel/Gold (Ni/Au). In one example, the pads 1210 are applied to the substrate 1202 and provide electrical contact to the end-user circuit board 1208.

The MEMS device (or devices) 1206 may be, for example, a transducer or silicon-based microphone such the silicon condenser microphone disclosed in U.S. Pat. Nos. 5,870,482, 7,166,910, and/or 6,781,231, the disclosures of which are incorporated by reference herein in their entirety for all purposes. The MEMS device 1206 may also be a surface mountable component. Other functions may be performed by MEMS devices.

The electrical connections of the package are configured such that the MEMS device 1206 can communicate with the end-user circuit board 1208. In this regard, various traces, wires, other electrical components (e.g., capacitors or resistors) or other electrical coupling arrangements may be used. These components may be incorporated in a separate conductive layer or may be utilized according to some other approach.

The end-user circuit board 1208 may be any type of circuit board arrangement used to provide a variety of functions. In one example, the end-user circuit board 1208 is a printed circuit board 1208 that processes sound received from the MEMS device 1206. Other examples of functions may also be provided by the end-user circuit board 1208.

Figure 13A:
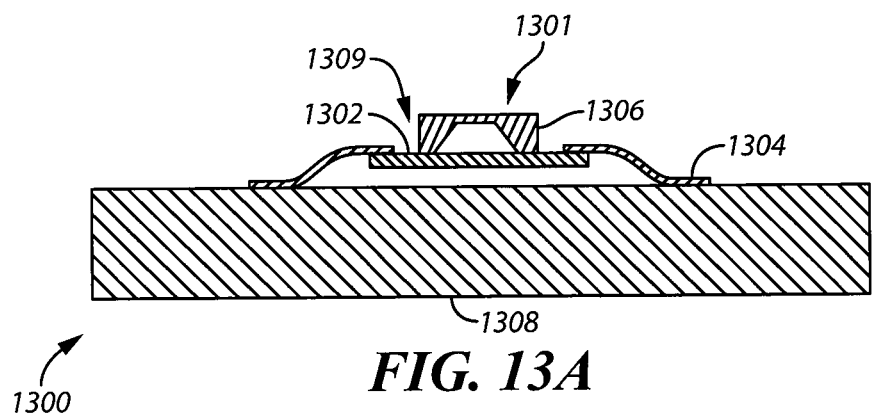
FIG. 13a is a cross-sectional view of another example of a bridge utilized in a MEMS package according to various embodiments of the present invention.
Figure 13B:
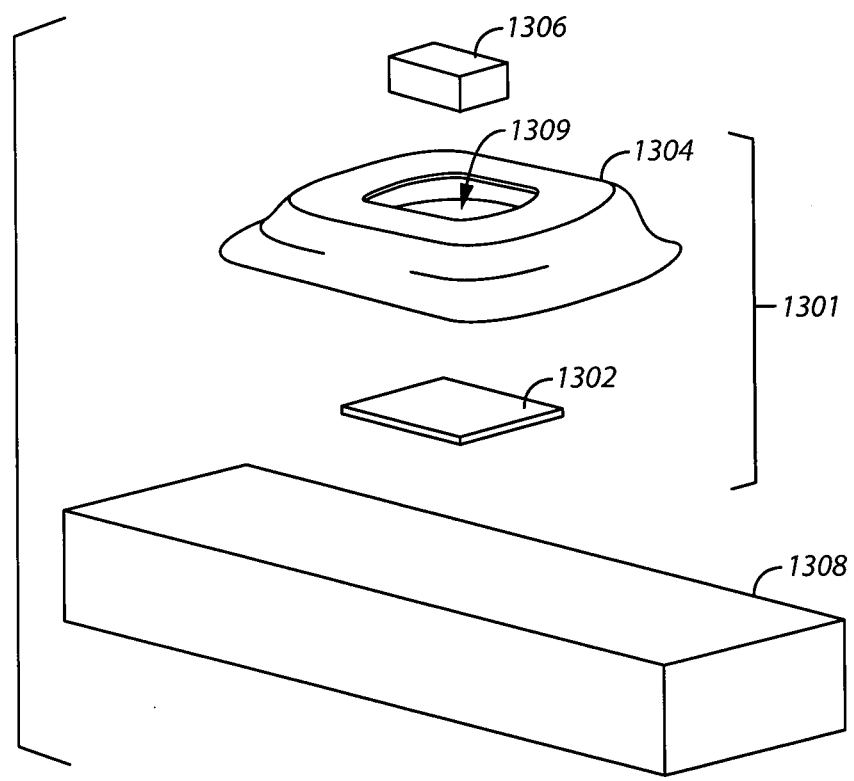
FIG. 13b is an exploded perspective view of the bridge of FIG. 13 according to various embodiments of the present invention.
Figure 14:
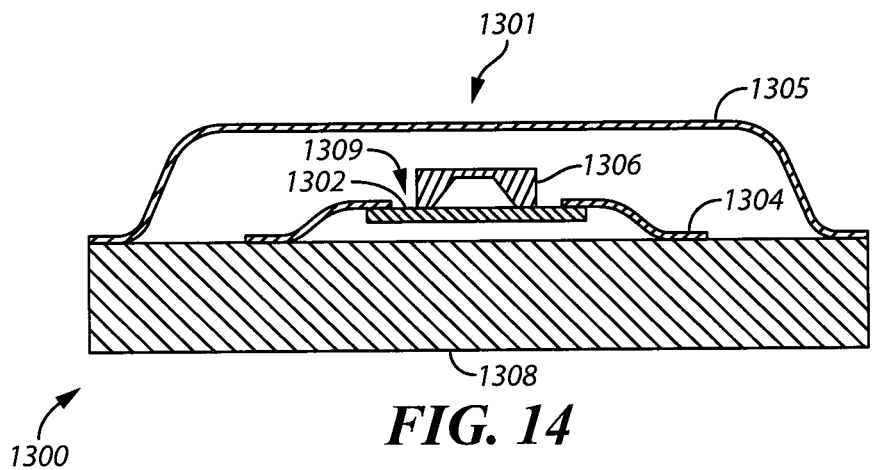
FIG. 14 is a cross-sectional view of still another example of a bridge utilized in a MEMS package according to various embodiments of the present invention.

Referring now to FIGS. 13*a*, 13*b*, and 14, another example of a bridge used in MEMS package is described. The MEMS package 1300 includes a bridge 1301 and the bridge includes a substrate 1302 and a first elastically deformable element 1304. A MEMS device 1306 is coupled to the substrate 1302. The first elastically deformable element 1304 is coupled to an end-user circuit board 1308 by a coupling arrangement such as glue, fasteners, or the like. Other coupling arrangements may also be used. An opening 1309 in the elastically deformable element 1304 is covered by the substrate 1302. The opening 1309 extends through the first elastically deformable element 1304 and the substrate 1302 covers the opening 1309 and is coupled to the bottom surface of the first elastically deformable element 1304.

The example of FIG. 14 is similar to the example of FIGS. 13*a* and 13*b* except that a second elastically deformable element 1305 is coupled to an end-user circuit board 1308. The second elastically deformable element 1305 dissipates stress received from the circuit board 1308 as well as provides protection for the various bridge components.

The substrate 1302 may be constructed of a variety of materials. In one example, the substrate 1302 is constructed from a FR-4 fiberglass reinforced epoxy resin that allows forming the substrate into board panel form, thus taking advantage of economies of scale in manufacturing. Other examples of materials may be used for the substrate 1302. In one example, the thickness of the substrate 1302 is 0.3 mm.

The first and second elastically deformable elements 1304 and 1305 may be constructed from a wide variety of materials. In one example, the elastically deformable elements 1304 and 1305 are constructed of a thin layer of polyimide, or poly-tetrafluoro-ethylene (PTFE). Other examples of materials may be used for the elastically deformable elements 1304 and 1305. In one example, the thickness of the elastically deformable elements 1304 and 1305 is 0.025 mm.

In the examples of FIGS. 13*a*, 13*b*, and 14 the substrate 1302 is generally block shaped. The horizontal cross-sectional shape of the substrate 1302 is generally a square or rectangular ring-shaped. However, any type of ring shape or non-ring circular shape (e.g., ellipses, circles) may also be employed.

The elastically deformable elements 1304 and 1305 are constructed of generally compliant (flexible) materials as compared to the substrate 1302. When the end-user circuit board 1308 deforms under shock or a load, the elastically deformable elements 1304 and 1305 strain to absorb the force, thereby minimizing or eliminating the stress, strain, or other force transfer to the MEMS device 1306. The different elements of the bridge 1301 are formed during manufacturing and may include depositing, and/or any other technique or approach.

The amount of force that can be absorbed and/or dissipated by the bridge 1301 depends upon a variety of factors. For example, the amount of strain, stress, or other forces that can be absorbed by the bridge 1301 may be a function of the modulus of elasticity of the elastically deformable elements 1304 and 1305, the thickness of the elastically deformable elements 1304 and 1305, the size of the MEMS device 1306, to name a few factors. These factors may be used to select the materials used to construct the bridge and the dimensions of the bridge. In addition, other factors may also be considered when determining the material composition and dimensions of the bridge.

Acoustic ports or other apertures may also be provided in the bridge 1301. For example, the substrate 1302 may include one or more acoustic ports and the MEMS device 1306 may communicate with these ports.

Additionally, the location of the MEMS device 1306 may be changed or adjusted. For example, the MEMS device 1306 may be attached to the bottom side rather than the top side of the elastically deformable element 1304. Consequently, in this alternative approach the height of the MEMS device 1306 is "zeroed out." In other words, the height of the MEMS device 1306 is effectively zero when determining the height of the package 1300.

In other examples, the substrate 1302 and the elastically deformable element 1304 may utilize multiple layers of conductive and/or non-conductive materials having sufficient rigidity. It is to be understood that materials other than those described above may be utilized as well as materials not necessary having rigidity.

The MEMS device (or devices) 1306 may be, for example, a transducer or silicon-based microphone such the silicon condenser microphone disclosed in U.S. Pat. Nos. 5,870,482, 7,166,910, and/or 6,781,231, the disclosures of which are incorporated by reference herein in their entirety for all purposes. The MEMS device 1306 may also be a surface mountable component. Other functions may be performed by MEMS devices.

The electrical connections of the package are configured such that the MEMS device 1306 can communicate with the end-user circuit board 1308. In this regard, various traces, wires, other electrical components (e.g., capacitors or resistors) or other electrical coupling arrangements may be used. These components may be incorporated in a separate conductive layer or by using some other approach.

The end-user circuit board 1308 may be any type of circuit board arrangement used to provide a variety of functions. In one example, the end-user circuit board 1308 is a printed circuit board 1308 that processes sound received from the MEMS device 1306. Other examples of functions may also be provided by the end-user circuit board 1308.

Figure 15:
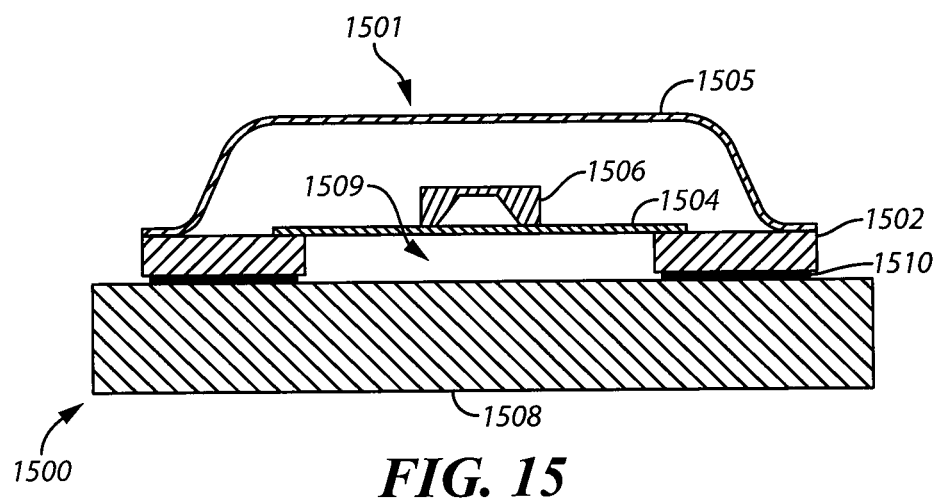
FIG. 15 is a cross-sectional view of yet another example of a bridge utilized in a MEMS package according to various embodiments of the present invention.

Referring now to FIG. 15, another example of a MEMS package 1500 is described. The MEMS package 1500 includes a bridge 1501 and the bridge 1501 includes a substrate 1502 and a first elastically deformable element 1504. A MEMS device 1506 is coupled to the first elastically deformable element 1504. The substrate 1502 is coupled to an end-user circuit board 1508 by contact pads 1510. A second elastically deformable element 1505 surrounds the MEMS device 1506 and is coupled to the substrate 1502. An opening 1509 extends through the substrate 1502. The opening 1509 is covered by the first elastically deformable element 1504.

The substrate 1502 may be constructed of a variety of materials. In one example, the substrate 1502 is constructed from a FR-4 fiberglass reinforced epoxy resin that allows forming the substrate into board panel form, thus taking advantage of economies of scale in manufacturing. Other examples of materials may be used for the substrate 1502. In one example, the thickness of the substrate 1502 is 0.3 mm.

The first and second elastically deformable elements 1504 and 1505 may be constructed from a wide variety of materials. In one example, the first and second elastically deformable elements 1504 and 1505 are constructed of a thin layer of polyimide, or poly-tetrafluoro-ethylene (PTFE). Other examples of materials may be used for the elastically deformable elements 1504 and 1505. In one example, the thicknesses of the elastically deformable element 1504 and 1505 are 0.025 mm.

The second elastically deformable element 1505 may be coupled to the substrate 1502 by any suitable technique such as glue, fasteners, or the like. In the example of FIG. 15, the second elastically deformable element 1505 is coupled to the substrate 1502 at an outer edge of the substrate 1502.

In the example of FIG. 15, the substrate 1502 has a horizontal cross-sectional shape that is generally square or rectangular ring-shaped. However, any type of ring shape or non-ring circular shape (e.g., ellipses, circles) may also be employed.

The first elastically deformable element 1504 is constructed of a generally compliant (flexible) material as compared to the substrate 1502. When the end-user circuit board 1508 deforms under shock or a load, the first elastically deformable element 1504 and the second elastically deformable element 1505 strain to absorb the force, thereby minimizing or eliminating the stress, strain, or other force transfer to the MEMS device 1506. In this regard, the aggregate rigidity of the portion of the package in proximity to the MEMS device 1506 is less than the aggregate rigidity of the remainder of the package. The different elements of the bridge 1501 are formed during manufacturing and may be formed using any suitable technique such as depositing, and/or any other technique or approach.

The amount of force that can be absorbed and/or dissipated by the bridge 1501 depends upon a variety of factors. For example, the amount of strain, stress, or other forces that can be absorbed by the bridge 1501 may be a function of the modulus of elasticity of the elastically deformable elements 1504 and 1505, the thickness of the elastically deformable elements 1504 and 1505, the size of the MEMS device 1506, to name a few factors. These factors may be used to select the materials used to construct the bridge and the dimensions of the bridge. In addition, other factors may also be considered when determining the materials and dimensions of the bridge.

Acoustic ports or other apertures may also be provided in the bridge 1501. For example, the first elastically deformable element 1504 may include one or more acoustic ports and the MEMS device 1506 may communicate with these ports.

Additionally, the location of the MEMS device 1506 may be changed or adjusted. For example, the MEMS device 1506 may be attached to the bottom side rather than the top side of the first elastically deformable element 1504. Consequently, in this alternative approach the height of the MEMS device 1506 is "zeroed out." In other words, the height of the MEMS device 1506 is effectively zero when determining the height of the package 1500.

In other examples, the substrate 1502 and the elastically deformable element 1504 may utilize multiple layers of conductive and/or non-conductive materials having sufficient rigidity. It is to be understood that materials other than those described above may be utilized as well as materials not necessary having rigidity.

The contact pads 1510 may be made, for example, of Copper (Cu) with a finishing layer of either Tin (Sn) or Nickel/Gold (Ni/Au). In one example, the pads 1510 are applied to the substrate 1502 and provide electrical contact to an end-user circuit board 1508.

The MEMS device (or devices) 1506 may be, for example, a transducer or silicon-based microphone such the silicon condenser microphone disclosed in U.S. Pat. Nos. 5,870,482, 7,166,910, and/or 6,781,231, the disclosures of which are incorporated by reference herein in their entirety for all purposes. The MEMS device 1506 may also be a surface mountable component. Other functions may be performed by MEMS devices.

The electrical connections of the package are configured such that the MEMS device 1506 can communicate with the end-user circuit board 1508. In this regard, various traces, wires, other electrical components (e.g., capacitors or resistors) or other electrical coupling arrangements may be used. These components may be incorporated in a separate conductive layer or by using some other approach.

The end-user circuit board 1508 may be any type of circuit board arrangement used to provide a variety of functions. In one example, the end-user circuit board 1508 is a printed circuit board 1508 that processes sound received from the MEMS device 1506. Other examples of functions may also be provided by the end-user circuit board 1508.

Figure 16:
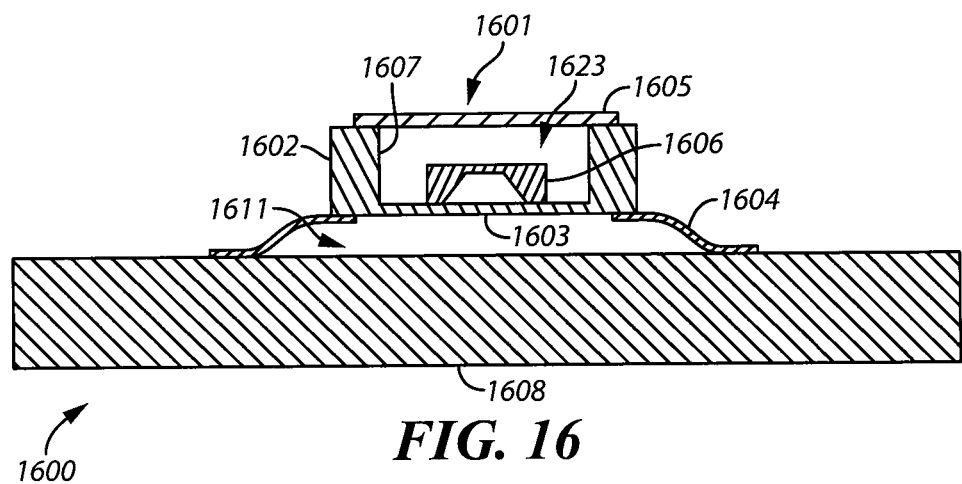
FIG. 16 is a cross-sectional view of another example of a bridge utilized in a MEMS package according to various embodiments of the present invention.

Referring now to FIG. 16, another example of a bridge used in MEMS package is described. The MEMS package 1600 includes a bridge 1601 and the bridge includes a substrate 1602, a first elastically deformable element 1604, and a second elastically deformable element 1605. A MEMS device 1606 is coupled to the substrate 1602. The first elastically deformable element 1604 is coupled to an end-user circuit board 1608. Other coupling arrangements may also be used. An opening 1611 formed in the elastically deformable element 1604 is covered by the substrate 1602. The substrate 1602 has a lower portion 1603 and a side portion 1607. A second elastically deformable element 1605 is coupled to the side portion 1607 on an upper surface of the side portion 1607. The couplings mentioned above may be accomplished by glue, fasteners, or any other suitable coupling arrangement.

In the example of FIG. 16, the substrate 1602 is generally block shaped with a recess 1623 formed by the lower portion 1603 and the side portion 1607. The horizontal cross-sectional shape of the substrate 1602 is generally square or rectangular ring-shaped. However, any type of ring shape or non-ring circular shape (e.g., ellipses, circles) may also be employed. The dimensions of the different portions may also vary.

The substrate 1602 may be constructed of a variety of materials. In one example, the substrate 1602 is constructed from a FR-4 fiberglass reinforced epoxy resin that allows forming the substrate into board panel form, thus taking advantage of economies of scale in manufacturing. Other examples of materials may be used for the substrate 1602. In one example, the thickness of the substrate 1602 is 0.3 mm across the top surface while it is 0.5 mm in a vertical direction.

The first and second elastically deformable elements 1604 and 1605 may be made from a wide variety of materials. In one example, the elastically deformable elements 1604 and 1605 are constructed of a thin layer of polyimide, or polytetrafluoro-ethylene (PTFE). Other examples of materials may be used for the elastically deformable elements 1604 and 1605. In one example, the thicknesses of the elastically deformable elements 1604 and 1605 are 0.025 mm.

The elastically deformable elements 1604 and 1605 are constructed of a generally compliant (flexible) material as compared to the substrate 1602. When the end-user circuit board 1608 deforms under shock or a load, the elastically deformable elements 1604 and 1605 strains to absorb the force, thereby minimizing or eliminating the stress, strain, or other force transfer to the MEMS device 1606. The different elements of the bridge 1601 are formed during manufacturing and may include depositing, and/or forming or any other technique or approach.

The amount of force that can be absorbed and/or dissipated by the bridge 1601 depends upon a variety of factors. For example, the amount of strain, stress, or other forces that can be absorbed by the bridge 1601 may be a function of the modulus of elasticity of the elastically deformable elements 1604 and 1605, the thickness of the elastically deformable elements 1604 and 1605, the size of the MEMS device 1606, to name a few factors. These factors may be used to select the materials used to construct the bridge and the dimensions of the bridge. In addition, other factors may also be considered when determining the materials and dimensions of the bridge.

Acoustic ports or other apertures may also be provided in the bridge 1601. For example, the substrate 1602 may include one or more acoustic ports and the MEMS device 1606 may communicate with these ports.

In other examples, the substrate 1602 and the elastically deformable element 1604 may utilize multiple layers of conductive and/or non-conductive materials having sufficient rigidity. It is to be understood that materials other than those described above may be utilized as well as materials not necessary having rigidity.

The MEMS device (or devices) 1606 may be, for example, a transducer or silicon-based microphone such the silicon condenser microphone disclosed in U.S. Pat. Nos. 5,870,482, 7,166,910, and/or 6,781,231, the disclosures of which are incorporated by reference herein in their entirety for all purposes. The MEMS device 1606 may also be a surface mountable component. Other functions may be performed by MEMS devices.

The electrical connections of the package are configured such that the MEMS device 1606 can communicate with the end-user circuit board 1608. In this regard, various traces, wires, other electrical components (e.g., capacitors or resistors) or other electrical coupling arrangements may be used. These components may be incorporated in a separate conductive layer or using some other approach.

The end-user circuit board 1608 may be any type of circuit board arrangement used to provide a variety of functions. In one example, the end-user circuit board 1608 is a printed circuit board 1608 that processes sound received from the MEMS device 1606. Other examples of functions may also be provided by the end-user circuit board 1608.

Referring now to FIGS. 18, 19, 20, 21, 22, 23, 24, and 25 an example of a MEMS package 1800 is described. The MEMS package 1800 includes a bridge 1801 and the bridge includes a first substrate 1802, a second substrate 1819 and a first elastically deformable element 1804. The second substrate 1819 covers an opening 1817 in the elastically deformable element 1804. A MEMS device 1806 is positioned on an upper surface of the second substrate 1819. The first substrate 1802 is coupled to an end-user circuit board 1808 by contact pads 1810.

The first and second substrates 1802 and 1819 may be constructed of a variety of materials. In one example, the substrate 1802 and 1819 are constructed from a FR-4 fiberglass reinforced epoxy resin that allows forming the substrate into board panel form, thus taking advantage of economies of scale in manufacturing. Other examples of materials may be used for the substrates 1802 and 1819. In one example, the thickness of the substrates 1802 and 1819 are 0.3 mm.

The elastically deformable element 1804 may be made from a wide variety of materials. In one example, the elastically deformable element 1804 is constructed of a thin layer of polyimide, or poly-tetrafluoro-ethylene (PTFE). Other examples of materials may be used for the elastically deformable element 1804. In one example, the thickness of the elastically deformable element 1804 is 0.025 mm.

In the example of FIG. 18-25, the horizontal cross-sectional shapes of the substrates 1802 and 1819 are generally square or rectangular ring-shaped. However, any type of ring shape or non-ring circular shape (e.g., ellipses, circles) may also be employed.

The elastically deformable element 1804 is constructed of a generally compliant (flexible) material as compared to the substrates 1802 and 1819. When the end-user circuit board 1808 deforms under shock or a load, the elastically deformable element 1804 strains to absorb the force, thereby minimizing or eliminating the stress, strain, or other force transfer to the MEMS device 1806. In this regard, the aggregate rigidity of the portion of the package in proximity to the MEMS device 1806 is less than the aggregate rigidity of the remainder of the package. The different elements of the bridge 1801 are formed during manufacturing and may include depositing, and/or any other technique or approach.

The amount of force that can be absorbed and/or dissipated by the bridge 1801 depends upon a variety of factors. For example, the amount of strain, stress, or other forces that can be absorbed by the bridge 1801 may be a function of the modulus of elasticity of the elastically deformable element 1804, the thickness of the elastically deformable element 1804, the size of the MEMS device 1806, to name a few factors. These factors may be used to select the materials used to construct the bridge and the dimensions of the bridge. In addition, other factors may also be considered when determining the materials and dimensions of the bridge.

Acoustic ports or other apertures may also be provided in the bridge 1801. For example, the second substrate 1819 may include one or more acoustic ports and the MEMS device 1806 may communicate with these ports.

Additionally, the location of the MEMS device 1806 may be changed or adjusted. For example, the MEMS device 1806 may be attached to the reverse side of the elastically deformable element 1804. Consequently, in this alternative approach the height of the MEMS device 1806 is "zeroed out." In other words, the height of the MEMS device 1806 is effectively zero when determining the height of the package 1800.

In other examples, the first substrate 1802, the second substrate 1819, and the elastically deformable element 1804 may utilize multiple layers of conductive and/or non-conductive materials having sufficient rigidity. It is to be understood that materials other than those described above may be utilized as well as materials not necessary having rigidity.

The contact pads 1810 may be made, for example, of Copper (Cu) with a finishing layer of either Tin (Sn) or Nickel/Gold (Ni/Au). In one example, the pads 1810 are applied to the substrate 1802 and provide electrical contact to the end-user circuit board 1808.

The MEMS device (or devices) 1806 may be, for example, a transducer or silicon-based microphone such the silicon condenser microphone disclosed in U.S. Pat. Nos. 5,870,482, 7,166,910, and/or 6,781,231, the disclosures of which are incorporated by reference herein in their entirety for all purposes. The MEMS device 1806 may also be a surface mountable component. Other functions may be performed by MEMS devices.

The electrical connections of the package are configured such that the MEMS device 1806 can communicate with the end-user circuit board 1808. In this regard, various traces, wires, other electrical components (e.g., capacitors or resistors) or other electrical coupling arrangements may be used. These components may be incorporated in a separate conductive layer or by using some other approach.

The end-user circuit board 1808 may be any type of circuit board arrangement used to provide a variety of functions. In one example, the end-user circuit board 1808 is a printed circuit board 1808 that processes sound received from the MEMS device 1806. Other examples of functions may also be provided by the end-user circuit board 1808.

Figure 18:
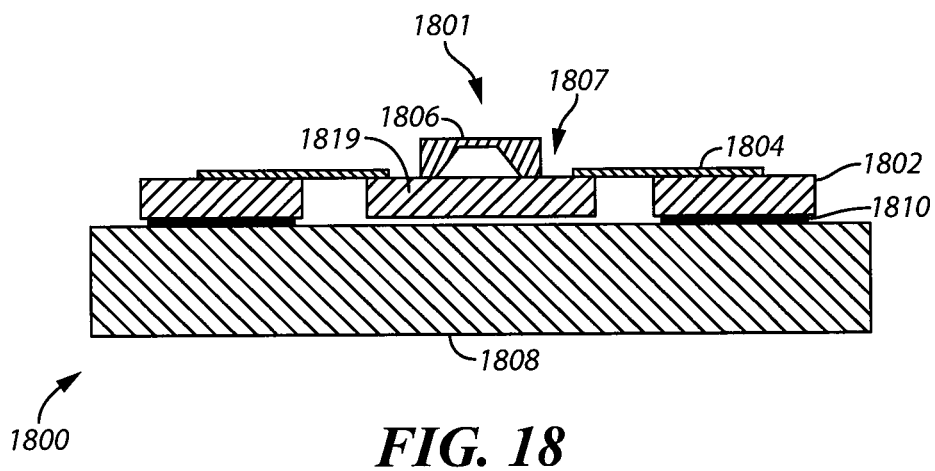
FIG. 18 is a cross-sectional view of yet another example of a bridge utilized in a MEMS package according to various embodiments of the present invention.
Figure 22:
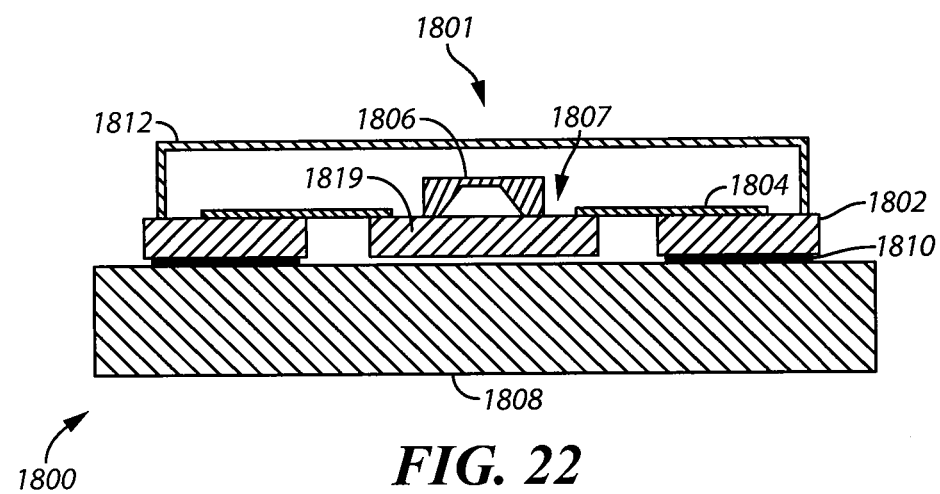
FIG. 22 is a cross-sectional view of another example of a bridge utilized in a MEMS package according to various embodiments of the present invention.

FIG. 22 shows an arrangement that is similar in construction and function to the bridge 1801 in FIG. 18 except that a housing 1812 surrounds the MEMS device 1806 and is coupled to the first substrate 1802. The housing 1812 may be coupled to the first substrate 1802 by any suitable technique such as glue, fasteners, or any other suitable approach. The housing 1812 may be constructed of any suitable material such as plastic, metal, or combinations of materials. In the example of FIG. 18, the housing 1812 is coupled to the first substrate at an outer edge of the first substrate 1802.

Figure 24:
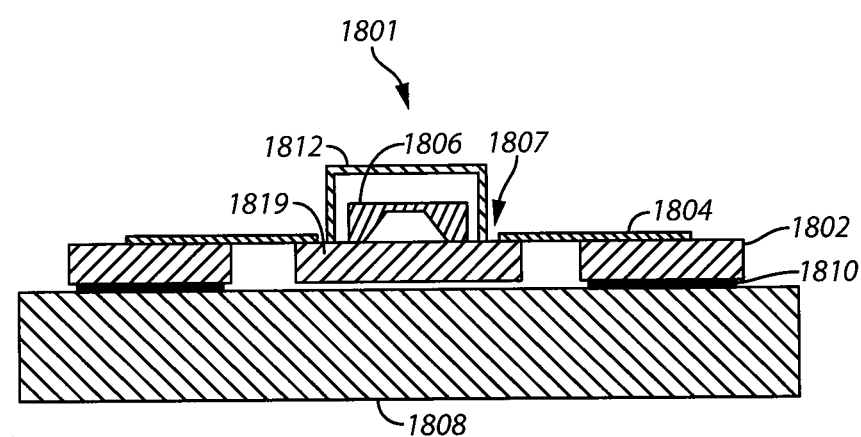
FIG. 24 is a cross-sectional view of yet another example of a bridge utilized in a MEMS package according to various embodiments of the present invention.

Referring now to FIG. 24, another example of a MEMS package similar to the examples of FIGS. 18 and 22 is described. In the example of FIG. 24, the housing 1812 is coupled to the second substrate 1819 and is smaller in size. The coupling of the housing 1812 to the second substrate 1819 may be accomplished by glue, fasteners, or any other suitable technique. The smaller size of the housing 1812 may be used to fit the MEMS package 1800 in to environments that require a smaller, less bulky package size.

Figure 21:
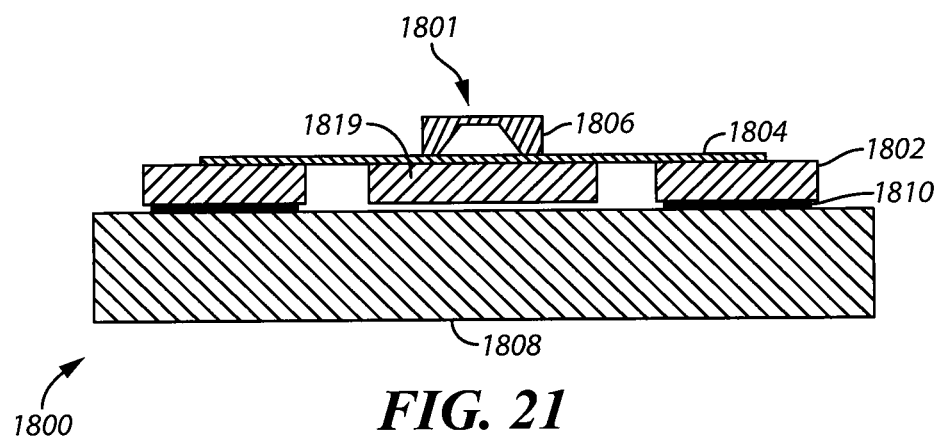
FIG. 21 is a cross-sectional view of yet another example of a bridge utilized in a MEMS package according to various embodiments of the present invention.
Figure 23:
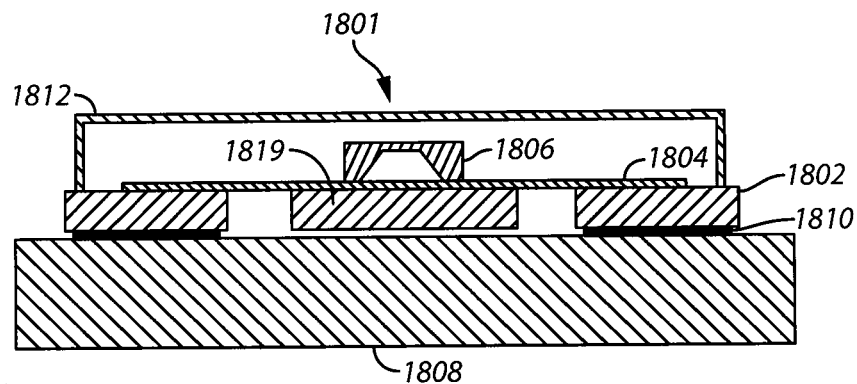
FIG. 23 is a cross-sectional view of still another example of a bridge utilized in a MEMS package according to various embodiments of the present invention.
Figure 25:
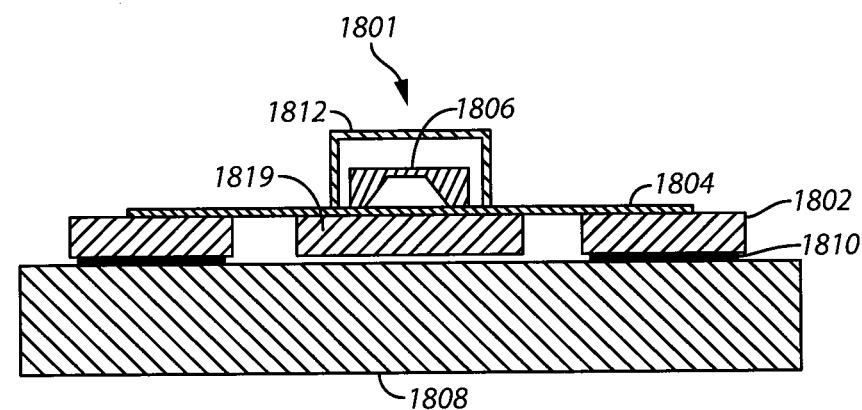
FIG. 25 is a cross-sectional view of another example of a bridge utilized in a MEMS package according to various embodiments of the present invention.

Referring now to FIGS. 21, 23, and 25 other examples of the MEMS package 1800 are shown and are similar to the device of FIG. 18 except that there is no opening in the elastically deformable element and the MEMS 1808 is disposed on top of the elastically deformable element. FIG. 21 does not include a housing while FIG. 23 includes a housing 1812 that is coupled to the first substrate 1802. FIG. 25 shows an arrangement where the housing is smaller that the housing of FIG. 23 and is coupled to the second substrate 1819.

Figure 19:
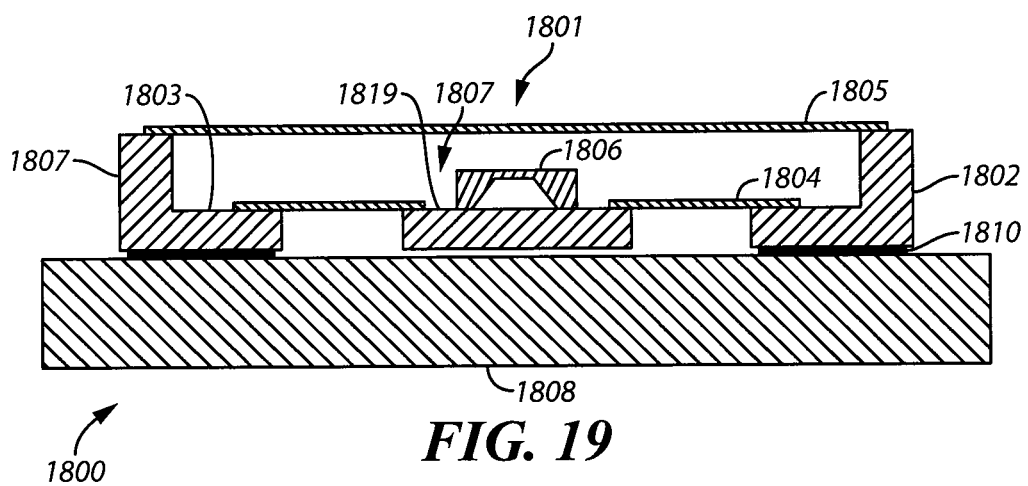
FIG. 19 is a cross-sectional view of another example of a bridge utilized in a MEMS package according to various embodiments of the present invention.

Referring now to FIG. 19, an arrangement similar to FIG. 18 is described. In the example of FIG. 19, the first substrate 1802 has a lower portion 1803 and a side portion 1807. A second elastically deformable element 1805 is coupled to the side portion 1807 on an upper surface of the side portion 1807. The second elastically deformable element 1805 further dissipates forces received from the end-user circuit board 1808.

Figure 20:
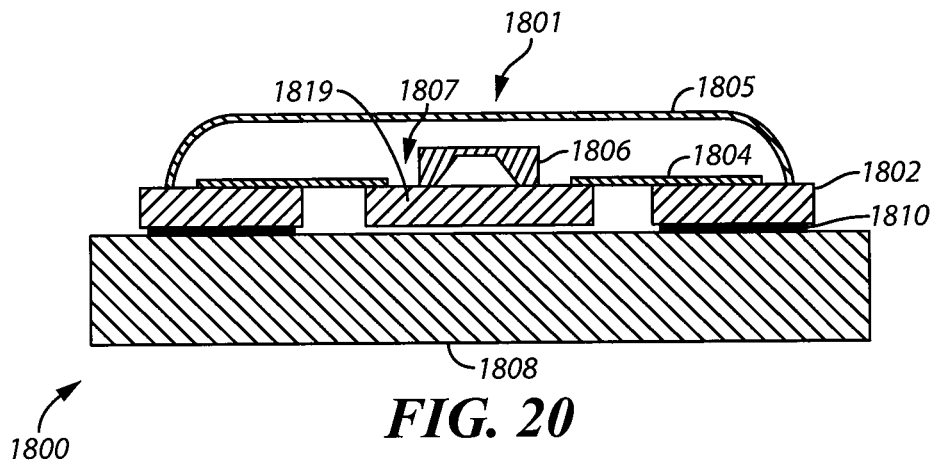
FIG. 20 is a cross-sectional view of still another example of a bridge utilized in a MEMS package according to various embodiments of the present invention.

Referring now to FIG. 20, an arrangement similar to FIG. 19 is described. In the example of FIG. 20, the second elastically deformable element 1805 is shaped to function as a housing to surround the MEMS device 1806. Additionally, the second deformable element 1805 dissipates stress and other forces. The second elastically deformable element 1805 is coupled to the first substrate 1802.

Thus, approaches are described that provide for the significant reduction or elimination of stress, strain, or other forces in MEMS packages (used in mobile communication or other electronic devices) thereby protecting MEMS and other sensitive devices deployed in these packages. The approaches use a bridge that is coupled between a circuit board and a sensitive MEMS device to significantly reduce or eliminate stress or strain imparted on the circuit board before the stress, strain, or other force can reach the MEMS device. In so doing, damage and/or dislodging of the MEMS device is prevented, thereby preventing malfunction or failure of the electronic device.

Preferred embodiments of this invention are described herein, including the best mode known to the inventors for carrying out the invention. It should be understood that the illustrated embodiments are exemplary only, and should not be taken as limiting the scope of the invention.

What is claimed is:

1. A MicroElectroMechanical System (MEMS) package comprising:
a MEMS device that includes a diaphragm;
a circuit board; and
a elastically deformable bridge member that is separate from the diaphragm, the bridge member having a first portion and a second portion, the bridge member being coupled to the MEMS device at the first portion and coupled to the circuit board at the second portion, the elastically deformable bridge member at least partially absorbing and dissipating mechanical strain communicated from the circuit board to the elastically deformable bridge member before the mechanical strain can reach the MEMS device.

2. The MEMS package of claim 1 wherein the elastically deformable bridge member comprises:
a first substrate layer;
a second substrate layer; and
a elastically deformable element residing between the first substrate layer and the second substrate layer, the elastically deformable element being coupled to the MEMS device;
a plurality of contact members applied to the first substrate layer and the second substrate layer, the plurality of contact members at least partially surrounding the elastically deformable element, the plurality of contact members being coupled to the circuit board.

3. The MEMS package of claim 1 wherein the MEMS device is a microphone.

4. The MEMS package of claim 1 wherein the circuit board defines a hole and the bridge member at least partially covers the hole.

5. The MEMS package of claim 4 wherein the MEMS device at least partially resides within the hole in the circuit board.

6. A strain absorption bridge for use in a MicroElectroMechanical System (MEMS) package comprising:
a first substrate layer configured to be attachable to a circuit board;
a first elastically deformable element coupled to the first substrate layer, the first elastically deformable element configured to be attachable to a MicroElectroMechanical (MEMS) device; and
wherein the elastically deformable element at least partially absorbs and dissipates mechanical strain communicated from the circuit board before the mechanical strain can reach the MEMS device;
wherein the MEMS device includes a diaphragm and the first elastically deformable element is separate from the diaphragm.

7. The strain absorption bridge of claim 6 wherein the first substrate layer is ring-shaped and defines a first opening extending to the circuit board.

8. The strain absorption bridge of claim 6 further comprising a housing, the housing being coupled to the first substrate layer.

9. The strain absorption bridge of claim 6 further comprising a housing, the housing being coupled to the first elastically deformable element.

10. The strain absorption bridge of claim 6 further comprising a second elastically deformable element that is arranged to at least partially enclose the MEMS device and the first elastically deformable element.

11. The strain absorption bridge of claim 10 further comprising a second substrate layer that is coupled to the first substrate layer and wherein the second elastically deformable element is supported by the second substrate layer.

12. The strain absorption bridge of claim 6 further comprising a second substrate layer, and wherein the first elastically deformable element is coupled to the first substrate layer and the second substrate layer.

13. A strain absorption bridge for use in a MicroElectro-Mechanical System (MEMS) package comprising:
a first substrate layer wherein the first substrate layer is configured to be coupled to a MicroElectroMechanical (MEMS) device that includes a diaphragm; and
a first elastically deformable element that is separate from the diaphragm and is coupled to the first substrate layer and which at least partially absorbs and dissipates mechanical strain communicated from a circuit board before the mechanical strain can reach the MEMS device.

14. The strain absorption bridge of claim 13 wherein the first elastically deformable element defines an opening extending to the first substrate layer.

15. The strain absorption bridge of claim 13 wherein the first elastically deformable element is configured to be coupled to the circuit board.

16. The strain absorption bridge of claim 15 further comprising a second elastically deformable element that at least partially encloses the first elastically deformable element.

17. The strain absorption bridge of claim 13 further comprising a housing that is configured to enclose the MEMS device.

18. The strain absorption bridge of claim 13 further comprising a second substrate layer, wherein the first elastically deformable element is configured to be coupled to the second substrate layer.

19. The strain absorption bridge of claim 18 further comprising a second elastically deformable element that at least partially encloses the MEMS device.

20. The strain absorption bridge of claim 19 wherein the second elastically deformable element is coupled to a third substrate layer.

21. The strain absorption bridge of claim 19 wherein the second elastically deformable element is coupled to the first substrate layer.

22. The strain absorption bridge of claim 13 further comprising a housing and wherein the housing is coupled to the first substrate layer and at least partially encloses the MEMS device.

* * * * *